(12) United States Patent
Tanaka

(10) Patent No.: US 7,514,332 B2
(45) Date of Patent: Apr. 7, 2009

(54) SEMICONDUCTOR DEVICE AND METHOD FOR MANUFACTURING THE SAME

(75) Inventor: Hiroyuki Tanaka, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 363 days.

(21) Appl. No.: 11/276,546

(22) Filed: Mar. 6, 2006

(65) Prior Publication Data

US 2006/0199344 A1 Sep. 7, 2006

(30) Foreign Application Priority Data

Mar. 7, 2005 (JP) ............................. 2005-063096

(51) Int. Cl.
*H01L 21/336* (2006.01)
*H01L 21/8238* (2006.01)
(52) U.S. Cl. .................. 438/305; 438/289; 438/297; 257/E21.424; 257/E21.427
(58) Field of Classification Search ......... 438/135–136, 438/137, 142, 156, 173–175, 192, 206, 212, 438/202–208, 234–239, 180–181, 197, 217, 438/228, 232, 526–527, 289, 297; 257/E21.41, 257/E21.629, E21.382–E21.385, E21.695–E21.696, 257/E21.19–E21.21, E21.394–E21.458, E21.615–E21.694, 257/E21.424, E21.427

See application file for complete search history.

(56) References Cited

U.S. PATENT DOCUMENTS 5,547,880 A * 8/1996 Williams et al. ............ 438/420
5,602,046 A * 2/1997 Calafut et al. .............. 438/237
6,025,237 A * 2/2000 Choi .......................... 438/301
6,724,040 B2 * 4/2004 Fujihira ...................... 257/328
7,005,354 B2 * 2/2006 Pan et al. .................... 438/286
2005/0042815 A1 * 2/2005 Williams et al. ............ 438/202
2005/0191831 A1 * 9/2005 Tagawa ...................... 438/519

FOREIGN PATENT DOCUMENTS

| JP | 5/343675 A | 12/1993 |
|---|---|---|
| JP | 2000/349093 A | 12/2000 |
| JP | 2001/127294 A | 5/2001 |

* cited by examiner

*Primary Examiner*—M. Wilczewski
*Assistant Examiner*—Maliheh Malek
(74) *Attorney, Agent, or Firm*—Rabin & Berdo, P.C.

(57) ABSTRACT

A method for manufacturing a semiconductor device includes the steps of (a) forming a first region by selectively ion-implanting a second conductive type impurity into a first conductive type semiconductor layer without thermally diffusing an impurity, (b) forming a gate electrode including an edge vicinity region that is aligned with the first region in the horizontal position, and (c) forming a body layer including the first region and a second region that is formed adjacent to the first region and self-aligned with the first region and an edge of the gate electrode by forming the second region with a step of selectively ion-implanting a second conductive type impurity into the first conductive type semiconductor layer without thermally diffusing an impurity.

10 Claims, 14 Drawing Sheets

SEMICONDUCTOR DEVICE AND METHOD FOR MANUFACTURING THE SAME

BACKGROUND OF THE INVENTION

Field of the Invention

The present invention relates to a semiconductor device and a method for manufacturing the same, especially a double diffused structure of a lateral power metal-oxide-semiconductor field effect transistor (MOSFET) and a method for manufacturing the same.

Recently, the importance of a power IC in which a power MOSFET is incorporated has been increasing along with the rapid popularization of mobile devices and the enhancement of the communications technology. For example, heretofore known methods for manufacturing a power MOSFET are disclosed in Japan Patent Application Publication JP-A-2000-349093 (especially, page 5 and FIG. 5), Japan Patent Application Publication JP-A-2001-127294 (especially, page 6 and FIG. 8(b)), and Japan Patent Application Publication JP-A-05-34675 (especially paragraph 0011 and FIG. 3).

Japan Patent Application Publication JP-A-2000-349093 discloses a method for manufacturing a power MOSFET that has a vertical double diffused structure. In this method, for the purpose of forming a p-type body layer in a desired region located immediately under a gate, boron (B) is ion-implanted into the desired region after the gate is formed, and it is thermally diffused by a thermal treatment at 1175 degrees Celsius for 30-60 minutes.

Japan Patent Application Publication JP-A-2001-127294 discloses a method for manufacturing a power MOSFET that has a vertical double diffused structure. In this method, for the purpose of forming a p-type body layer in a desired region located immediately under a gate, boron (B) is ion-implanted into the desired region after the gate is formed, and it is thermally diffused by a thermal treatment at 1050 degrees Celsius for seven hours.

Japan Patent Application Publication JP-A-05-34675 disclosed a method for manufacturing a power MOSFET that has a lateral double diffused structure. In this method, for the purpose of forming a p-type body layer located immediately under a gate, boron (B) is implanted into the desired region after the gate is formed, and it is thermally diffused by a thermal treatment at approximately 1100 degrees Celsius for 500-700 minutes.

According to the above described heretofore known methods in which a p-type body layer is formed by thermal diffusion, a thermal treatment needs to be conducted for a long period of time (e.g., tens of minutes to several hours) at approximately 1100 degrees Celsius in order to thermally diffuse p-type impurities into a region located below a gate electrode after the p-type impurities are ion-implanted. Also, the impurity ions, such as phosphorus (P), are generally added to the gate electrode of the power MOSFET to reduce the sheet resistance. Therefore, the following problems are produced.

First, because the thermal diffusion treatment is performed at a high temperature for a long period of time, the impurities, such as phosphorus (P), included in the polysilicon comprising a gate electrode are diffused, and penetrate a gate insulating film and diffuse into a silicon substrate. As a result, the device properties are changed.

Second, it is difficult to control the formation of a p-type body layer in a desired region through a thermal diffusion treatment at a high temperature for a long period of time. Therefore, miniaturization of a device is difficult. More specifically, in the case of manufacturing a power MOSFET with a lateral double diffused structure, it is difficult to control the vertical inclination and the position of the boundary between a p-type body layer and an n-type offset layer, and the concentration profile of the impurities implanted into the p-type body layer and the n-type offset layer. Therefore, miniaturization of a device is difficult. When miniaturization of a device is difficult, it is difficult to reduce the on-state resistance of a device. As a result, it is difficult to reduce the power consumption.

Third, in the case of manufacturing a power MOSFET with a lateral double diffused structure, the channel resistance of a channel region in a p-type body layer and the threshold voltage of a gate need to be reduced in order to enhance the driving capability of a device. It is preferable to design the impurity concentration of the p-type body layer to be lower in order to reduce the channel resistance and the threshold voltage of the gate. On the other hand, it is necessary to enhance the punch-through resistance between an n-source region and an n-type offset layer in order to miniaturize a device. It is preferable to design the impurity concentration of the p-type body layer to be higher in order to enhance this punch-through resistance. Therefore, it has been difficult to meet the contradictory demands of enhancement of the driving capability of a device and enhancement of the punch-through resistance. As a result, further miniaturization of a device has been difficult. As described above, when miniaturization of a device is difficult, it is difficult to reduce the on-state resistance of a device. As a result, it is difficult to reduce the power consumption of a device.

In view of the above, it will be apparent to those skilled in the art from this disclosure that there exists a need for an improved semiconductor device and an improved method for manufacturing a semiconductor device. This invention addresses these needed in the art as well as other needs, which will become apparent to those skilled in the art from this disclosure.

SUMMARY OF THE INVENTION

It is therefore an objective of the present invention to resolve the above-described problems, and to provide a method for manufacturing a semiconductor device having a body layer without conducting a thermal diffusion treatment at a high temperature for a long period of time.

In addition, it is an objective of the present invention to provide a method for manufacturing a semiconductor device having a body layer without changing the device properties.

Furthermore, it is an objective of the present invention to provide a method for manufacturing a semiconductor device having a body layer, which enables further miniaturization of a device.

Moreover, it is an objective of the present invention to provide a method for manufacturing a semiconductor device having a body layer, which makes it easy to control the degree of the incline and the position of the boundary between a body layer and an offset layer, and the concentration profile of the impurities implanted into the body layer and the offset layer.

In addition, it is an objective of the present invention to provide a method for manufacturing a semiconductor device having a body layer, which enables further reduction of the power consumption of a device.

Furthermore, it is an objective of the present invention to provide a method for manufacturing a semiconductor device having a body layer, which makes it possible to meet the contradictory demands of enhancement of the driving capability of a device and enhancement of the punch-through resistance.

Moreover, it is an objective of the present invention to provide a semiconductor device having a body layer without conducting a thermal diffusion treatment at a high temperature for a long period of time.

In addition, it is an objective of the present invention to provide a semiconductor device having a body layer without changing the device properties.

Furthermore, it is an objective of the present invention to provide a semiconductor device having a body layer, which enables further miniaturization of a device.

Moreover, it is an objective of the present invention to provide a semiconductor device having a body layer, which makes it easy to control the degree of the incline and the position of the boundary between a body layer and an offset layer, and the concentration profile of the impurities implanted into the body layer and the offset layer.

In addition, it is an objective of the present invention to provide a semiconductor device having a body layer, which enables further reduction of the power consumption of a device.

Furthermore, it is an objective of the present invention to provide a semiconductor device having a body layer, which makes it possible to meet the contradictory demands of enhancement of the driving capability of a device and enhancement of the punch-through resistance.

In accordance with the present invention, a method for manufacturing a semiconductor device is comprised of the steps of (a) forming a first region by selectively ion-implanting a second conductive type impurity into a first conductive type semiconductor layer without conducting ant thermal diffusion of impurities, (b) forming a gate electrode that includes an edge vicinity region that is aligned with the first region in the horizontal position; and (c) forming a body layer that includes the first region and a second region that is formed adjacent to the first region and self-aligned with the first region and an edge of the gate electrode, by forming the second region by selectively ion-implanting the second conductive type impurity into the first conductive type semiconductor layer without conducting any thermal diffusion of impurities.

Here, it is preferable for the step of forming the first region to be conducted by selectively ion-implanting an impurity by using a first mask having an opening that has a first edge. Also, it is preferable for the step of forming the gate electrode to be conducted by defining an edge of the gate electrode by means of the first edge of the opening of the first mask. Also, it is preferable for the step of forming the second region to be conducted by at least ion-implanting the second conductive type impurity by using the edge vicinity region of the gate electrode as a mask, and thus it is preferable for the boundary between the first region and the second region to be self-aligned with the edge of the gate electrode. Also, it is preferable for the step of ion-implantation to form the first region to be conducted by changing the acceleration energy and the amount of dose to be implanted, and thus it is preferable for the first region to have an impurity profile in the depth direction, in which the impurity concentration of a shallow region that comprises the first region and which includes a channel region is lower than the impurity concentration of a deep region that comprises the first region and located below the shallow region.

Furthermore, in accordance with the present invention, a semiconductor device is comprised of (i) a first conductive type semiconductor layer, (ii) a gate electrode having an edge portion, and (iii) a second conductive type body layer comprised of (a) a first region that is formed adjacent to the first conductive type semiconductor layer, has a substantially vertical interface with the first conductive type semiconductor layer, and is located below a gate electrode and aligned with an edge vicinity region of the gate electrode in the horizontal position, and (b) a second region that is formed adjacent to the first region, and has a boundary with the first region which is aligned with the edge vicinity region. Here, it is preferable for the above described first region to be comprised of a shallow region including the channel region and a deep region that is located below the shallow region, and to have an impurity profile in the depth direction in which the impurity concentration of the shallow region is lower than that of the deep region.

Note that throughout the specification and the claims in accordance with the present invention, the term "horizontal position" means a direction that is included in a plane parallel to a substrate surface, in other words, a direction parallel to the channel length. Also, when a state of a portion or an element of a device is expressed as "vertical," this means that the portion of the element of the device is vertical to a substrate surface.

According to the present invention, the body layer of the semiconductor device is comprised of the first region and the second region, and these first and second regions are formed by different steps (i.e., a step of forming the first region and a step of forming the second region). In addition, the first region and the second region, both of which comprise the body layer, are formed by ion implantation steps that are independent of each other. However, thermal diffusion treatments are not conducted after the ion-implantation step in forming the first region and the second region. Here, a region of the body layer, which is located immediately below the edge vicinity region of a gate electrode formation region and formed adjacent to an offset layer, is defined as the first region, and the rest of the body layer is defined as the second region. After selectively ion-implanting a first conductive type impurity into the second conductive type offset layer (i.e., the first ion-implantation step), the first region of the body layer is formed immediately below the edge vicinity region of the gate electrode formation region without conducting a thermal diffusion treatment of the impurity. Then, the gate electrode is formed in the gate electrode formation region. After this, the first conductive type impurity is selectively ion-implanted into the second conductive type offset layer by using the gate electrode as a mask (i.e., the second ion-implantation step). However, the second region of the body layer is formed, which is self-aligned with the edge of the gate electrode and the first region, without conducting a thermal diffusion treatment of the first conductive type impurity. As a result, the boundary between the first region and the second region, both of which comprise the body layer, is self-aligned with the edge of the gate electrode. Because of this, the body layer comprised of the first region and the second region is formed. In other words, in the step of forming the body layer, it is not necessary to thermally diffuse the impurity selectively implanted into the offset layer in the above described first and second ion-implantation steps into the edge vicinity region of the gate electrode. As described above, a thermal diffusion treatment is not conducted at a high temperature for a long period time in the present invention. Therefore, the present invention has the following effects.

First, the impurities, such as phosphorus (P) included in the polysilicon comprising a gate electrode, are not diffused because a body layer is formed without conducting a thermal diffusion treatment at a high temperature for a long period of time. Therefore, the impurities implanted into a gate electrode do not penetrate a gate insulating film, and they are not thermally diffused into a channel region comprised of an upper region of a first region of a body layer. As a result, the device properties are not changed.

Second, it is easy to control the formation of a body layer in a desired region, because a body layer is formed without conducting a thermal diffusion treatment at a high temperature for a long period of time. Therefore, it is possible to further miniaturize a device. More specifically, in the case of a power MOSFET with a lateral double diffused structure, it is easy to ensure a substantially vertical boundary between a body layer and an offset layer, and to control the position of this boundary and the concentration profile of the impurities, which are implanted into both the body layer and the offset layer, in the crosswise direction. Because of this, it is possible to miniaturize a device, and this makes it possible to reduce the on-state resistance of a device. As a result, it is possible to reduce the power consumption of a device.

Third, the first region of the body layer can be comprised of the shallow region, which has the first impurity concentration and functions as a channel region, and the deep region, which has the second impurity concentration that is higher than the first impurity concentration and located below the shallow region, by conducting the first ion-implantation step to form the first region of the body layer, which is divided into a plurality of ion-implantation steps with different conditions of the acceleration energy and the amount of dose, because a thermal diffusion step is not needed. In other words, the first ion-implantation step to form the first region of the body layer is conducted by dividing this step into a plurality of ion-implantation steps with different conditions for the acceleration energy and the amount of the implantation dose, because the body layer is formed without conducting a thermal diffusion treatment at a high temperature for a long period of time. Thus it is possible to form the shallow region of the first region of the body layer, which functions as a channel region, to have a low impurity concentration, and to form the deep region, except for the channel region, to have a high impurity concentration. The following are the reasons to form the above described structure.

The channel resistance of a channel region in a body layer and the threshold voltage of a gate must be reduced in order to enhance the driving capability of a device. It is preferable to design the impurity concentration of a body layer to be lower in order to reduce the channel resistance and the threshold voltage of a gate. On the other hand, it is necessary to enhance the punch-through resistance between a source region and an offset layer in order to miniaturize a device. It is preferable to design the impurity concentration of a body layer to be higher in order to enhance the punch-through resistance. Therefore, it is possible to meet the contradictory demands of enhancement of the driving capability of a device and enhancement of the punch-through resistance, by setting the impurity concentration of the shallow region of the first region of the body layer, which functions as a channel, to be lower, and setting the impurity concentration of the deep region except for the channel to be higher. As a result, it is possible to further miniaturize a device. It is possible to reduce the on-state resistance of a device by miniaturizing a device. As a result, it is possible to reduce the power consumption of a device.

Fourth, it is possible to reduce the manufacturing time and the manufacturing cost by forming a body layer without conducting a thermal diffusion treatment at a high temperature for a long period of time.

Fifth, when a lateral power MOSFET and other elements are formed in the same substrate, the other elements are not influenced by a thermal diffusion treatment at a high temperature for a long period of time, because the body layer is formed without conducting a thermal diffusion treatment at a high temperature for a long period of time.

These and other objects, features, aspects, and advantages of the present invention will become apparent to those skilled in the art from reviewing the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
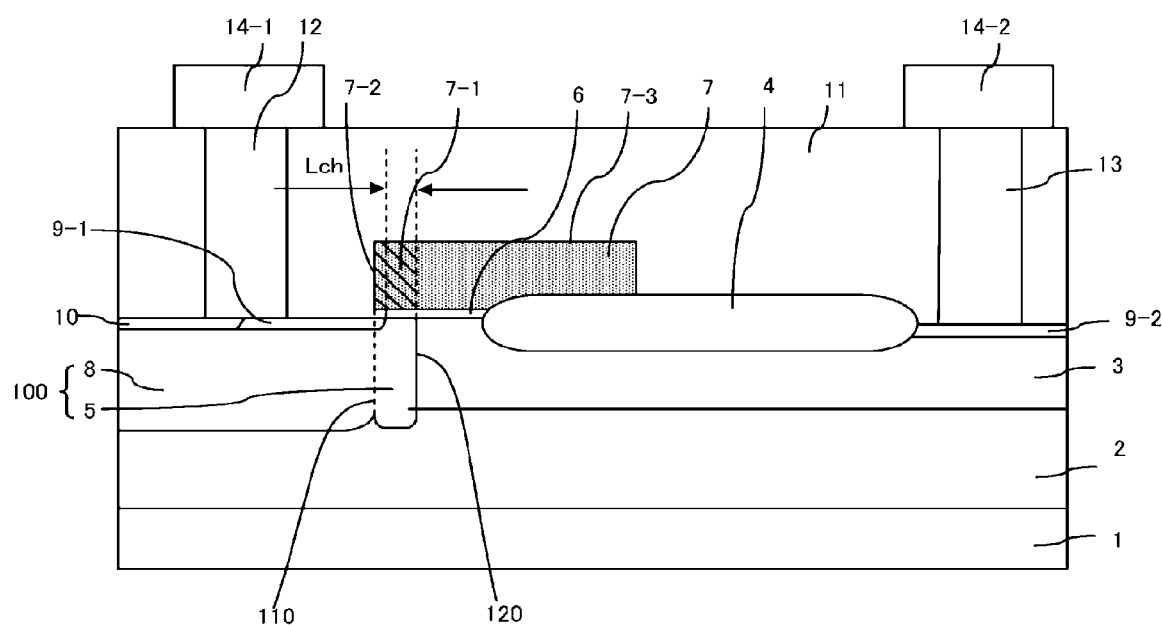
FIG. 1 is a partial vertical cross-section diagram of a lateral power MOSFET structure in accordance with a first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

According to the first embodiment of the present invention, in forming a body layer of a lateral power metal-oxide semiconductor field-effect transistor (hereinafter referred to as a lateral power MOSFET), a first region of the body layer, which is located immediately below an edge vicinity region of a gate electrode formation region and adjoins an offset layer, is formed before a gate electrode is formed, and a second region (i.e., the remaining region of the body layer) is formed after the gate electrode is formed. Thus, the body layer can be formed without conducting a thermal diffusion treatment at a high temperature for a long period of time.

Lateral Power MOSFET Structure

FIG. 1 is a partial vertical cross-section diagram showing a lateral power MOSFET structure in accordance with the first embodiment of the present invention.

The lateral power MOSFET in accordance with the first embodiment of the present invention has the following structure. An n-type epitaxial layer 2 is formed on a p-type semiconductor substrate 1. An n-type offset layer 3 and a p-type body layer 100 are selectively formed on the n-type epitaxial layer 2. The p-type body layer 100 is comprised of a first region 5 and a second region 8. The first region 5 is formed adjacent to the n-type offset layer 3. The second region 8 is separated from the n-type offset layer 3 through the first region 5. In other words, the first region 5 of the p-type body layer 100 is formed adjacent to the n-type offset layer 3 through a substantially vertical interface 120. As described below, ion-implantation is a step of implanting ions in the direction vertical to a substrate surface. Therefore, the interface 120 is formed to be substantially vertical to the surface of the p-type semiconductor substrate 1. The first region 5 of the p-type body layer 100 comes in contact with the second region 8 of the p-type body layer 100 through a boundary 110. The base of the first region 5 is located slightly below the interface between the n-type offset layer 3 and the n-type epitaxial layer 2. A $P^+$ layer 10 is formed in a portion of the upper region of the second region 8 of the p-type body layer 100. An $N^+$ source layer 9-1 is formed in a portion of the upper region of the first region 5 of the p-type body layer 100 and another portion of the upper region of the second region 8 of the p-type body layer 100. The $N^+$ source layer 9-1 is separated from the n-type offset layer 3 through the upper region of the first region 5 of the p-type body layer 100. This upper region functions as a cannel region. The horizontal dimension of this upper region, that is, the horizontal distance between the $N^+$ source layer 9-1 and the n-type offset layer 3, corresponds to a channel length Lch.

A field oxide film 4 is selectively formed on the n-type offset layer 3. An $N^+$ drain layer 9-2 is formed on the n-type offset layer 3. A gate insulating film 6 is formed on the first region 5 of the p-type body layer 100 and a portion of the n-type offset layer 3, which is located adjacent to the first region 5 of the p-type body layer 100. A gate electrode 7 is formed on the gate insulating film 6 and a portion of the field oxide film 4. The gate electrode 7 includes an edge vicinity region 7-1, an edge 7-2, and a planarized upper surface 7-3. The edge vicinity region 7-1 of the gate electrode 7 is formed immediately above the first region 5 of the p-type body layer 100. In other words, the edge vicinity region 7-1 is self-aligned with the first region 5 of the p-type body layer 100 in the horizontal position. Also, the edge 7-2 of the gate electrode 7 is self-aligned with the boundary 110 between the first region 5 and the second region 8, which comprise the p-type body layer 100, in the horizontal position. The edge vicinity region 7-1 of the gate electrode 7 is separated and electrically isolated from the p-type body layer 100 through a portion of the gate insulating film 6. The gate electrode 7 is separated and electrically isolated from the n-type offset layer 3 through the gate insulating film 6 and the field oxide film 4.

An interlayer insulating film 11 is formed on the $P^+$ layer 10, the $N^+$ source layer 9-1, the gate electrode 7, the field oxide film 4, and the $N^+$ drain layer 9-2. The interlayer insulating film 11 has a source contact hole and a drain contact hole. A source contact 12 is formed in the source contact hole. A drain contact 13 is formed in the drain contact hole. The base of the source contact 12 comes in contact with a portion of the $N^+$ source layer 9-1 and a portion of the $P^+$ layer 10. The $N^+$ source layer 9-1 and the $P^+$ layer 10 respectively have a high impurity concentration, so that they can have an ohmic contact with the source contact 12. The base of the drain contact 13 comes in contact with a portion of the $N^+$ drain layer 9-2. The $N^+$ drain layer 9-2 has a high impurity concentration so that it can have an ohmic contact with the drain contact 13. A source wiring layer 14-1 and a drain wiring layer 14-2 are formed on the interlayer insulating film 11. The source wiring layer 14-1 is electrically connected to the $N^+$ source layer 9-1 and the $P^+$ layer 10 through the source contact 12. The drain wiring layer 14-2 is electrically connected to the $N^+$ drain layer 9-2 through the drain contact 13. Also, the above described thickness of each layer and the above described concentration are not necessarily limited, and they can be arbitrarily designed with heretofore known design techniques.

The following are the main differences between the structure of heretofore known lateral MOSFETs and that of the lateral power MOSFET in accordance with the present invention.

As described above, the p-type body layer 100 is comprised of the first region 5 and the second region 8. Here, the first region 5 is formed adjacent to the n-type offset layer 3, and the second region 8 is separated from the n-type offset layer 3 through the first region 5. In addition, the boundary 110 between the first region 5 and the second region 8 is formed approximately vertical to the surface of the p-type semiconductor substrate 1. Also, the interface 120 between the first region 5 and the n-type offset layer 3 is substantially vertical. The interface 120 is also formed to be substantially vertical to the surface of the p-type semiconductor substrate 1. In addition, the edge 7-2 of the gate electrode 7 is aligned with the boundary 110 between the first region 5 and the second region 8, which comprise the p-type body layer 100, in the horizontal position. Also, the gate electrode 7 has the planarized upper surface 7-3. Method for manufacturing lateral power MOSFET The above described structural differences between the heretofore known lateral MOSFET and the lateral MOSFET in accordance with the present invention are attributed to a manufacturing process of the lateral power MOSFET in accordance with the present invention. Referring now to the drawings, the method for manufacturing the lateral power MOSFET in accordance with the present invention will be described in detail.

FIGS. 2A to 2C, 3A to 3C, 4A to 4C, 5A to 5C, 6A to 6C, and 7 are partial vertical cross-section diagrams showing a manufacturing process of the lateral power MOSFET in accordance with the first embodiment of the present invention.

Figure 2A:
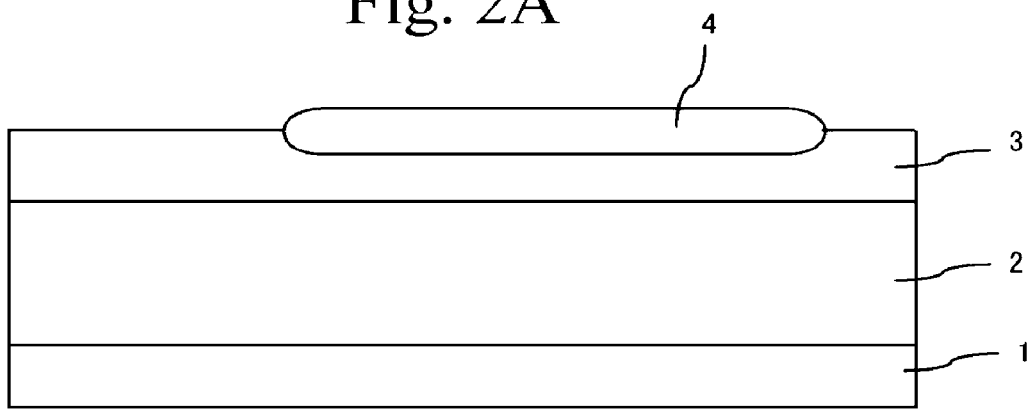
FIGS. 2A to 2C are partial vertical cross-section diagram of a lateral power MOSFET structure in accordance with the first embodiment of the present invention.

As shown in FIG. 2A, an n-type epitaxial layer 2 of 5 μm in thickness is formed on a p-type semiconductor substrate 1 (or a p-type silicon substrate 1). Then, the n-type impurity phosphorus ($P^+$) is implanted into an upper region of the n-type epitaxial layer 2 with an acceleration energy of 150 keV and a dose amount of $1.0 \times 10^{13}$ $cm^{-2}$. Then, an n-type offset layer 3 is formed in the upper region of the n-type epitaxial layer 2 by conducting a thermal treatment at approximately 950 degrees Celsius for 30 minutes. Then, a field oxide film 4 is formed on the n-type offset layer 3 with the local oxidation silicon (LOCOS) method.

Figure 2B:
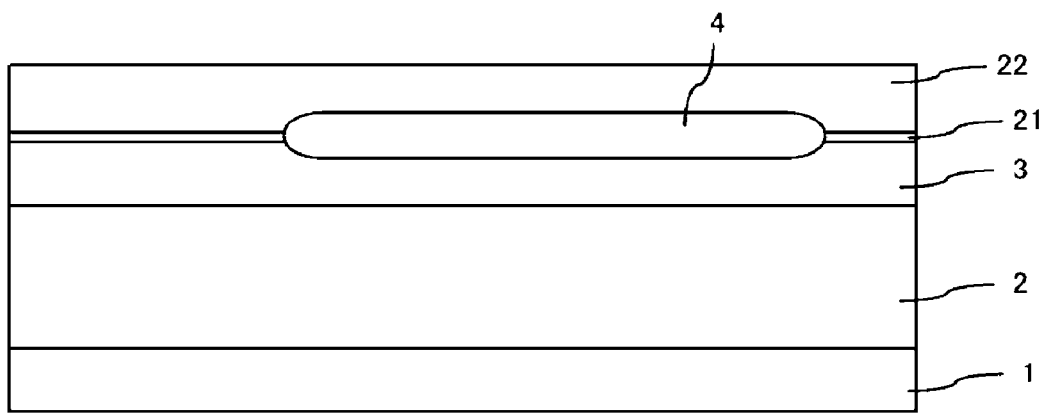

As shown in FIG. 2B, a silicon dioxide film 21 of 20 nm in thickness is formed on the n-type offset layer 3 with the thermal oxidation method. Next, a silicon nitride film 22 of 300 nm in thickness is formed on the silicon dioxide film 21 with the chemical vapor deposition (CVD) method.

Figure 2C:
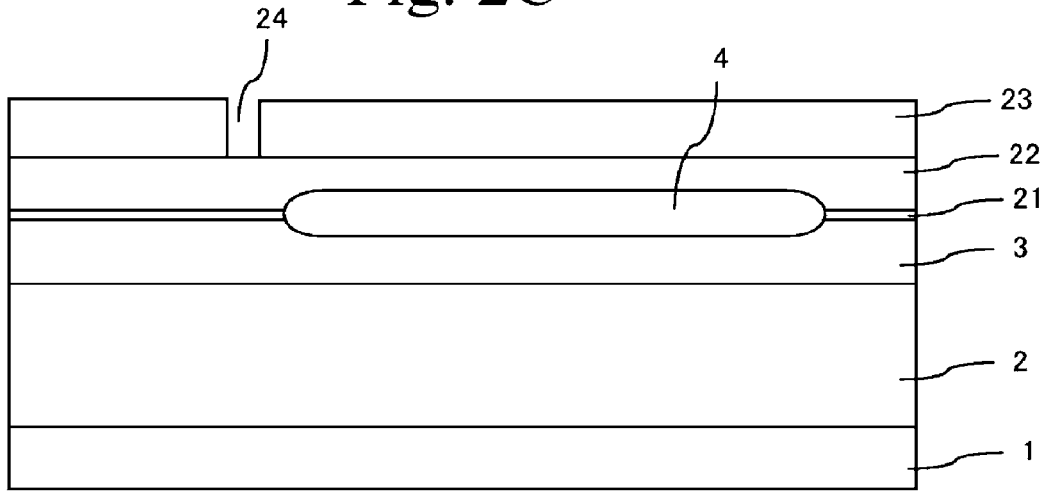

As shown in FIG. 2C, a resist film is applied to the upper surface of the silicon nitride film 22, and exposure and development are conducted with respect to the resist film. As a result, a resist pattern 23 is formed with an opening 24 of 300 nm in width in a first selected region.

Figure 3A:
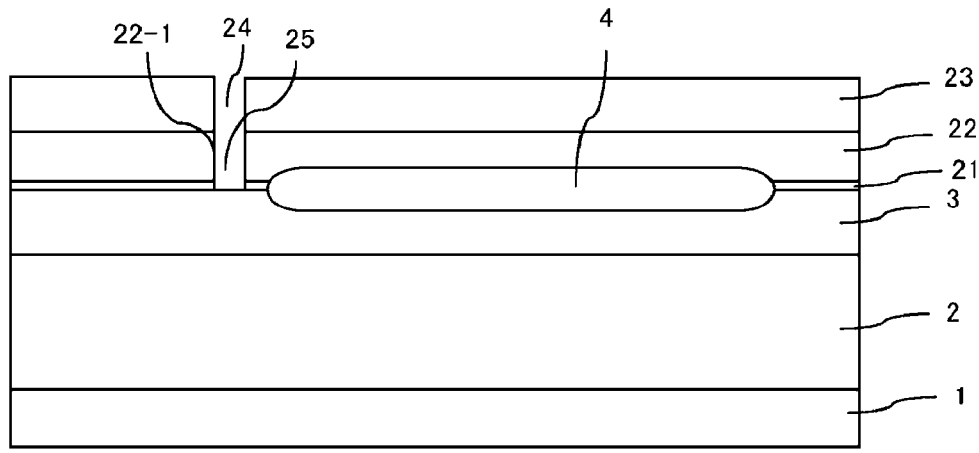
FIGS. 3A to 3C are partial vertical cross-section diagram of a lateral power MOSFET structure in accordance with the first embodiment of the present invention.

As shown in FIG. 3A, anisotropic etching is conducted by using the resist pattern 23 in which the opening 24 of 300 nm in width is formed as a mask. Thus, a portion of the silicon nitride film 22 and a portion of the silicon dioxide film 21, both of which are located immediately below the opening 24, are selectively eliminated. As a result, an opening 25 of 300 nm in width, which penetrates the silicon nitride film 22 and the silicon dioxide film 21, is formed. Also, this opening 25 has an edge 22-1.

Figure 3B:
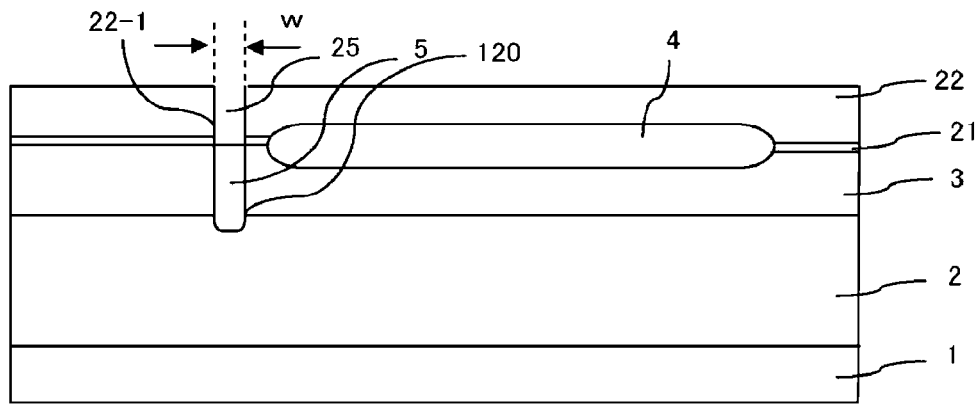

As shown in FIG. 3B, the resist pattern 23 is eliminated. Then, the p-type impurity boron ($B^+$) is ion-implanted into the n-type offset layer 3 and the upper surface vicinity region of the n-type epitaxial layer 2 by using the silicon nitride film 22 and the silicon dioxide film 21, both of which have the opening 25 of 300 nm in width as a mask, with an acceleration energy 150 keV and a dose amount of $5 \times 10^{13}$ $cm^{-2}$. Ion-implantation is hereinafter defined as a step of implanting ions in the direction vertical to the substrate surface. Next, a thermal treatment is conducted at approximately 960 degrees Celsius for 30 minutes, and the implanted impurities are activated. As a result, a first region 5 is selectively formed in the n-type offset layer 3 and the upper vicinity region of the n-type epitaxial layer 2. The base of the first region 5 is located slightly below the interface between the n-type offset layer 3 and the n-type epitaxial layer 2. The edge of the first region 5 is self-aligned with the edge 22-1 of the opening 25 in the horizontal position. It is important that the thermal diffusion of impurities, especially the thermal diffusion in the crosswise direction, is not caused during the thermal treatment at approximately 950 degrees Celsius for 30 minutes. In other words, it is preferable to conduct a thermal treatment for activating impurities in order to form the first region 5, but it is important to inhibit the temperature and time in a thermal treatment so that the thermal diffusion of impurities in the crosswise direction is not caused. Even if a thermal treatment for activating impurities in order to form the first region 5 is conducted, the thermal diffusion of impurities, especially the thermal diffusion of impurities in the crosswise direction, will not be caused, because this thermal treatment is not conducted at a high temperature for a long period time. Therefore, an interface 120 between the first region 5 and the n-type offset layer 3 can be formed to be substantially vertical. The interface 120 is formed to be substantially vertical to the surface of the p-type semiconductor substrate 1. Also, a thermal treatment for activating impurities may not be conducted in order to avoid the thermal diffusion of impurities in the crosswise direction. But either way, the thermal diffusion of impurities in the crosswise direction will not be caused during the formation of the first region 5. Because of this, a width W of the first region 5 is defined by the width of the opening 25. Therefore, the width W of the first region 5 is formed to be 300 nm.

Figure 3C:
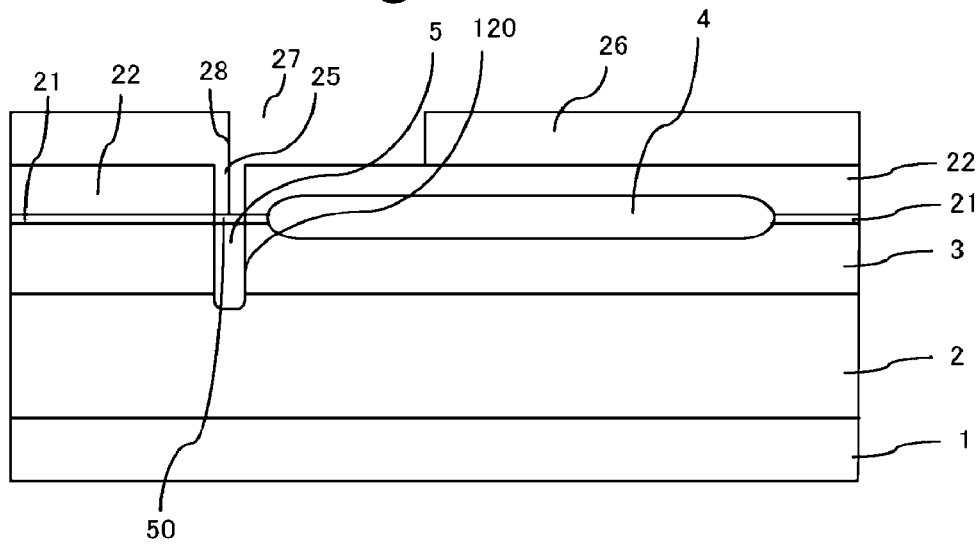

As shown in FIG. 3C, the exposed surface of the first region 5 located immediately below the opening 25 is oxidized by the thermal oxidization method. Thus, a silicon dioxide film 50 of 20 nm in thickness is formed. After this, a resist film is applied to the upper surface of the silicon nitride film 22 and the inside of the opening 25, and this resist is exposed and developed. Thus a resist pattern 26 is formed in which an opening 27 is formed in a second selected region. An edge 28 of the opening 27 formed in the resist pattern 26 is required to be located within the first region 5 in the horizontal position. Therefore, for the purpose of maximizing the latitude of the alignment accuracy with respect to the edge 28 of the opening 27 formed in the resist pattern 26, it is preferable to conduct a patterning for the resist film so that the edge 28 of the opening 27 formed in the resist pattern 26 is aligned in the middle of the first region 5 in the horizontal position. In this case, the above described latitude of the alignment accuracy can be set to half of the width of the first region 5 (i.e., half of 300 nm). As a result, the silicon dioxide film 50 is partially covered with the resist pattern 26.

Figure 4A:
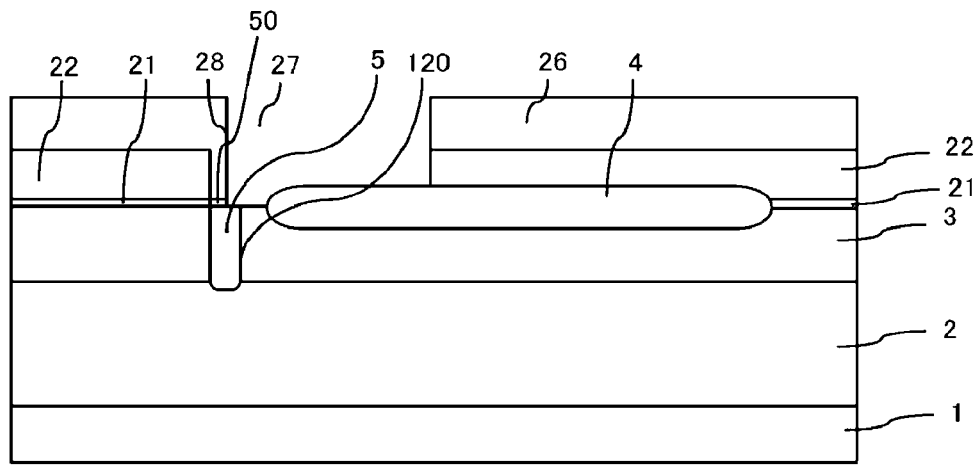
FIGS. 4A to 4C are partial vertical cross-section diagram of a lateral power MOSFET structure in accordance with the first embodiment of the present invention.

As shown in FIG. 4A, a portion of the silicon nitride film 22, a portion of the silicon dioxide film 21, and a portion of a silicon dioxide film 50, which are located immediately below the opening 27 formed in the resist pattern 26 and not covered by the resist pattern 26, are selectively eliminated with anisotropic etching by using the resist pattern 26 as a mask. Thus, a portion of the upper surface of the first region 5 and a portion of the upper surface of the n-type offset layer 3 are exposed.

Figure 4B:
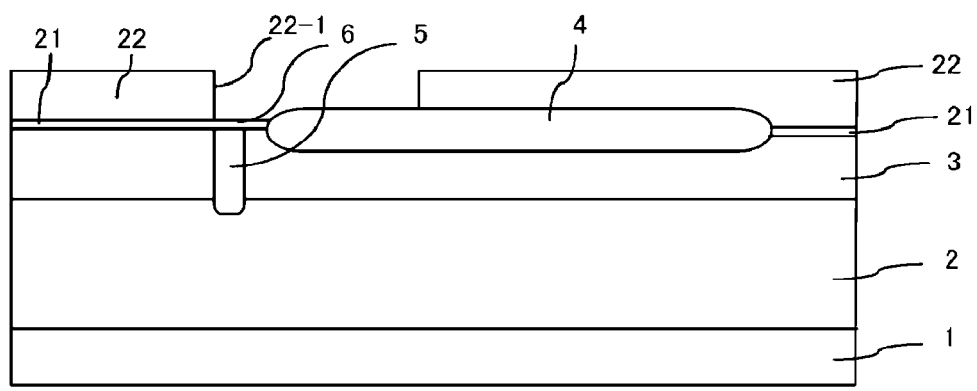

As shown in FIG. 4B, the resist pattern 26 is eliminated. In addition, the remaining portion of the silicon dioxide film 50, which is covered by the resist pattern 26, is eliminated. Then, a gate oxide film 6 of 20 nm in thickness is formed on the exposed upper surface of the first region 5 and the exposed upper surface of the n-type offset layer 3 with the thermal oxidization method.

Figure 4C:
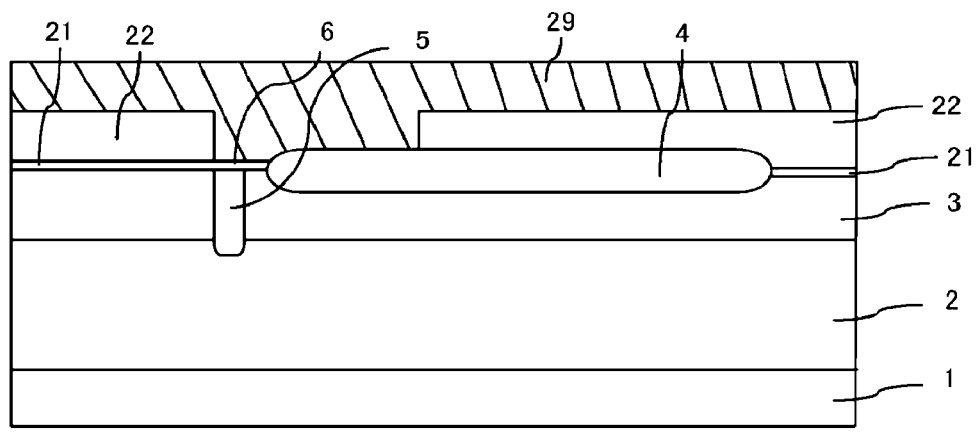

As shown in FIG. 4C, an n-type polysilicon film 29 including n-type impurities is deposited on the silicon nitride film 22, the field oxide film 4, and the gate oxidization film 6 with the chemical vapor deposition (CVD) method. Thus, the n-type polysilicon film 29 is completely implanted into the opening 27 formed in the silicon nitride film 22.

Figure 5A:
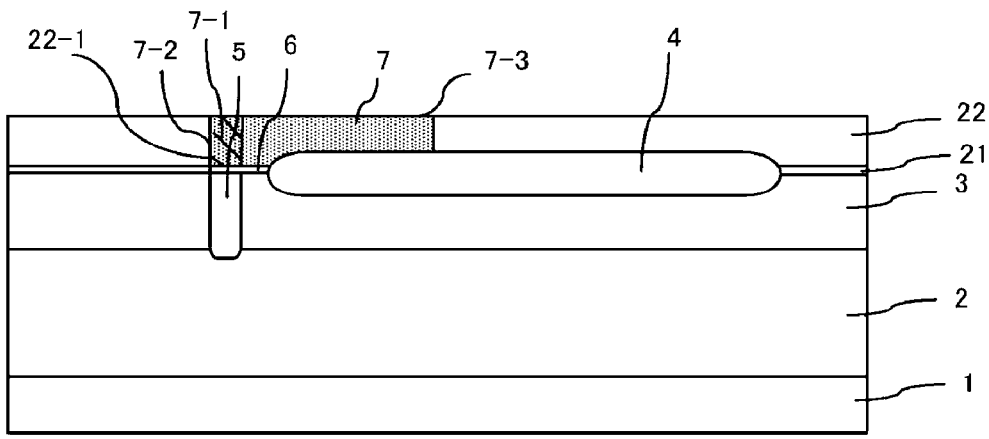
FIGS. 5A to 5C are partial vertical cross-section diagram of a lateral power MOSFET structure in accordance with the first embodiment of the present invention.

As shown in FIG. 5A, elimination of the n-type polysilicon film 29 is conducted by the chemical mechanical polishing (CMP) method until the upper surface of the n-type polysilicon film 29 is vertically aligned with the upper surface of the silicon nitride film 22. Thus, a gate electrode 7 comprised of an n-type polysilicon of 300 nm in thickness is formed. As a result of the CMP method, the gate electrode 7 has a planarized upper surface 7-3. Here, an edge 7-2 of the gate electrode 7 is defined by the edge 22-1 of the silicon nitride film 22. On the other hand, as described above in reference to FIG. 3B, the edge of the first region 5 is defined by the edge 22-1 of the opening 25 formed in the silicon nitride film 22. Therefore, the edge 7-2 of the gate electrode 7 is aligned with the edge of the first region 5 in the horizontal position. Therefore, the gate electrode 7 has an edge vicinity region 7-1 that is aligned with the first region 5 in the horizontal position. This means that the first region 5 is formed immediately below the edge vicinity region 7-1 of the gate electrode 7 without conducting a thermal diffusion treatment in the crosswise direction.

Figure 5B:
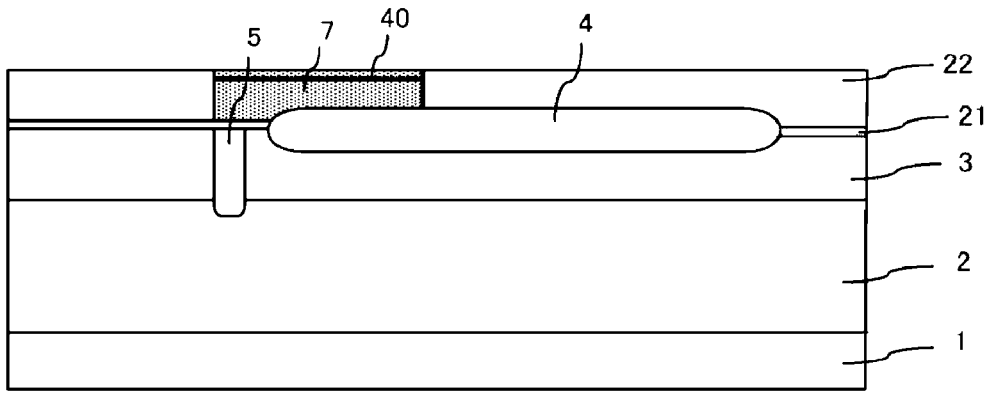

As shown in FIG. 5B, a silicon dioxide film 40 of 20 nm in thickness is formed in the upper portion of the gate electrode 7 comprised of an n-type polysilicon with the thermal oxidization method.

Figure 5C:
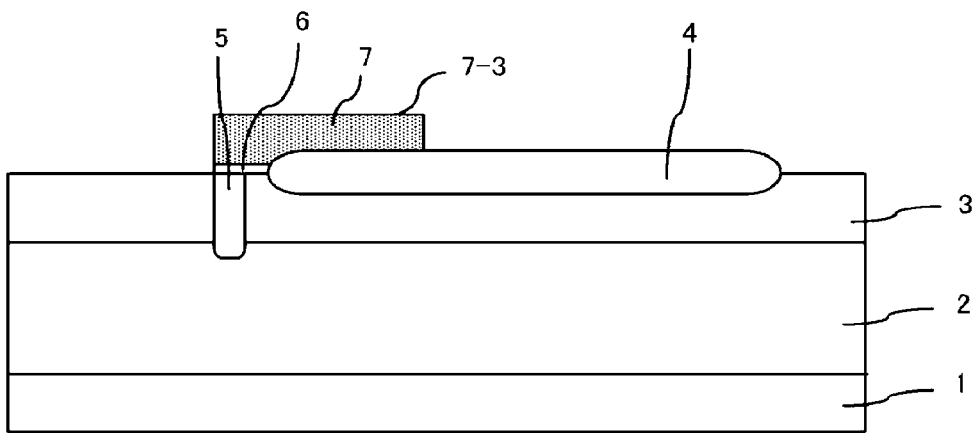

As shown in FIG. 5C, the silicon nitride film 22 and the silicon dioxide film 21 are sequentially eliminated with the wet etching method. Thus the upper surface of the n-type offset layer 3 is exposed. In this wet etching step, the silicon dioxide film 40 formed in the upper portion of the gate electrode 7 is eliminated, and the gate electrode 7 is prevented from being eliminated. As a result, the planarized upper surface 7-3 of the gate electrode 7 is exposed.

Figure 6A:
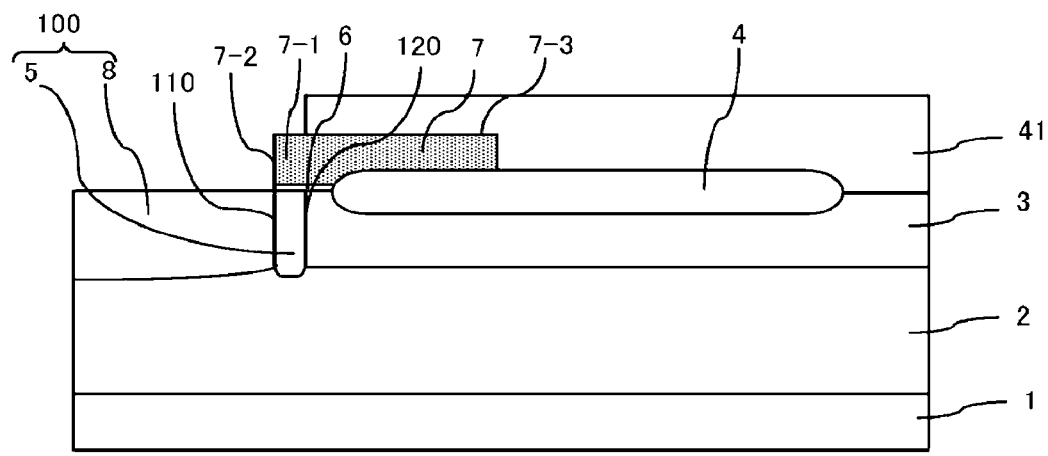
FIGS. 6A to 6C are partial vertical cross-section diagram of a lateral power MOSFET structure in accordance with the first embodiment of the present invention.

As shown in FIG. 6A, a resist film is applied to the upper surfaces of the field oxide film 4, the gate electrode 7, and the n-type offset layer 3, and this resist film is exposed and developed. Thus a resist pattern 41 is formed, which covers a portion of the planarized upper surface 7-3 of the gate electrode 7, the field oxide film 4, and the exposed upper surface of the n-type offset layer 3 on the drain side. Then, p-type impurity boron ($B^+$) is implanted into the n-type offset layer 3 and the upper vicinity region of the epitaxial layer 2 by using the resist pattern 41 and the edge vicinity region 7-1 as a mask with an acceleration energy of 150 keV and a dose amount of $5\times10^{13}$ cm$^{2}$. Then, a thermal treatment is conducted at approximately 950 degrees Celsius for 30 minutes, and the implanted impurities are activated. Thus a second region 8 is selectively formed. As a result, a p-type body layer 100 comprised of the first region 5 and the second region 8 is formed. The ion-implantation step to form the second region 8 of the p-type body layer 100, and the subsequent thermal treatment steps, are conducted with conditions identical to the conditions of the ion-implantation step used to form the above described first region 5 of the p-type body layer 100 and the subsequent thermal treatment steps.

In other words, the base of the second region 8 of the p-type body layer 100 is formed slightly below the interface between the n-type offset layer 3 and the n-type epitaxial layer 2. It is important that the thermal diffusion of impurities, especially the thermal diffusion in the crosswise direction, is not caused during the thermal treatment at approximately 950 degrees Celsius for 30 minutes. In other words, it is preferable to conduct a thermal treatment for activating impurities in order to form the second region 8 of the p-type body layer 100, but it is important to inhibit the temperature and time in a thermal treatment for activating the impurities in the second region 8 so that the thermal diffusion of impurities in the formed first region 5 of the p-type body layer 100 in the crosswise direction will not be caused. Even if a thermal treatment for activating impurities in order to form the second region 8 of the p-type body layer 100 is conducted, the thermal diffusion of impurities in the formed first region 5 of the p-type body layer 100, especially the thermal diffusion of impurities in the crosswise direction, will not be caused because this thermal treatment is not conducted at a high temperature for a long period of time. Therefore, the interface 120 between the first region 5 of the p-type body layer 100 and the n-type offset layer 3 can be formed to have a substantially vertical slope. The interface 120 is formed to be substantially vertical to the surface of the p-type semiconductor substrate 1. Also, to avoid the thermal diffusion of impurities in the crosswise direction, the thermal treatment for activating impurities does not have to be conducted. Furthermore, the ion-implantation step is conducted by using the resist pattern 41 and the edge vicinity region 7-1 as masks. Therefore, the boundary 110 between the first region 5 and the second region 8, which comprise the p-type body layer 100, is self-aligned with the edge 7-2 of the gate electrode 7.

As described above, the above described thermal treatment for activating impurities in the second region 8 of the p-type body layer 100 is not a thermal diffusion treatment at a high temperature for a long period of time, which causes the thermal diffusion of impurities. Therefore, even though the polysilicon comprising the gate electrode 7 includes the n-type impurity, this n-type impurity does not penetrate the gate oxide film 6 because of the thermal diffusion, and it is not thermally diffused into the n-type offset layer 3 and a channel region comprised of the upper region of the first region 5 of the p-type body layer 100, which is formed immediately below the gate oxide film 6. Therefore, the device properties are not changed.

Figure 6B:
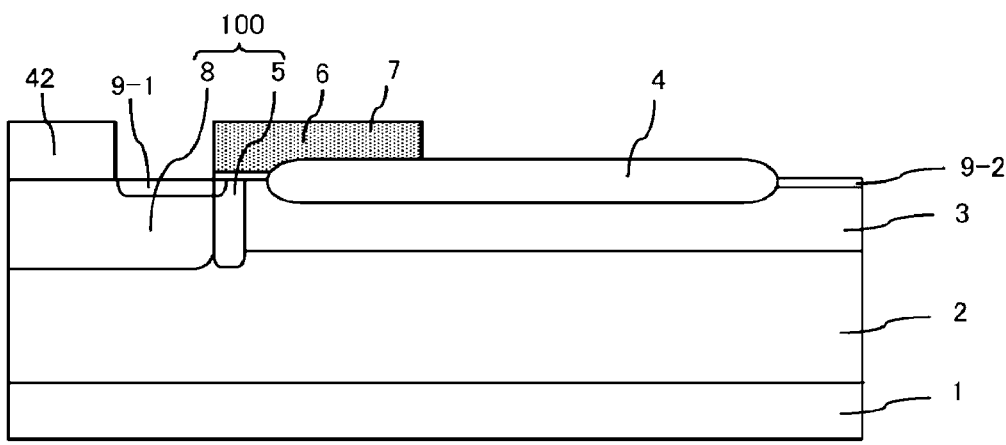

As shown in FIG. 6B, the resist pattern 41 is eliminated. Then, a resist film is applied to the upper surfaces of the second region 8 of the p-type body layer 100, the gate electrode 7, the field oxide film 4, and the n-type offset layer 3, and the resist film is exposed and developed. Thus a resist pattern 42 is formed, which covers a portion of the second region 8 except the portion of the second region 8 located adjacent to the first region 5. Then, the n-type arsenic ($As^+$) is implanted in the upper vicinity region of the second region 8 of the p-type body layer 100 and the upper vicinity region of the n-type offset layer 3 by using the resist pattern 42 as a mask with the acceleration energy of 50 keV and the dose amount of $5\times10^{15}$ cm$^{-2}$. Next, a thermal treatment is conducted at approximately 950 degrees Celsius for 30 minutes, and the implanted impurities are activated. Thus an $N^+$ source layer 9-1 and an $N^+$ drain layer 9-2 are formed in the upper vicinity region of the second region 8 of the p-type body layer 100 and the upper vicinity region of the n-type offset layer 3, respectively.

Figure 6C:
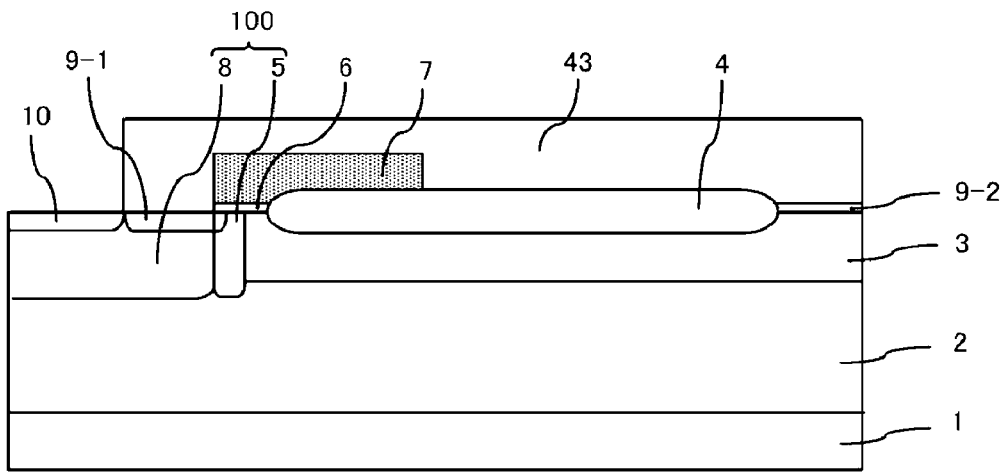

As shown in FIG. 6C, the resist pattern 42 is eliminated. Then, a resist film is applied to the exposed upper surface of the second region 8 of the p-type body layer 100, the exposed upper surface of the $N^+$ source layer 9-1, the exposed surface of the gate electrode 7, the exposed upper surface of the field oxide film 4, and the exposed upper surface of the $N^+$ drain layer 9-2, and the resist film is exposed and developed. Thus a resist pattern 43 is formed, which covers the upper surface of the $N^+$ source layer 9-1, the gate electrode 7, the field oxide film 4, and the $N^+$ drain layer 9-2. Then, the n-type impurity boron difluoride ($BF_2^+$) is implanted into the upper vicinity region of the second region 8 of the p-type body layer 100 by using the resist pattern 43 as a mask with an acceleration energy of 50 keV and a dose amount of $5\times10^{15}$ cm$^{-2}$. Next, a thermal treatment is conducted at approximately 950 degrees Celsius for 30 minutes and the implanted impurities are activated. Thus, a $P^+$ layer 10 is formed.

Figure 7:
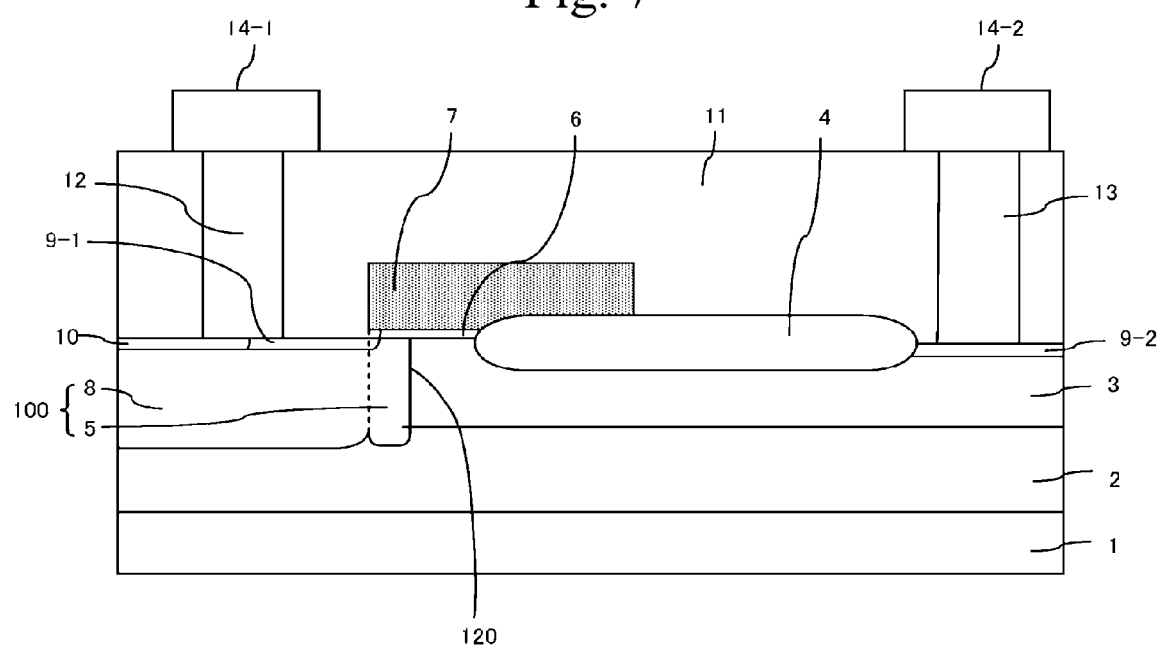
FIG. 7 is a partial vertical cross-section diagram of a lateral power MOSFET structure in accordance with the first embodiment of the present invention.

As shown in FIG. 7, the resist pattern 43 is eliminated. Then, an interlayer insulating film 11 is formed on the $P^+$ layer 10, the $N^+$ source layer 9-1, the gate electrode 7, the field oxide film 4, and the $N^+$ drain layer 9-2. Next, a source contact hole and a drain contact hole are formed in the interlayer insulating film 11 with a heretofore known method. A source contact 12 and a drain contact 13 are formed in the source contact hole and the drain contact hole, respectively. The base of the source contact 12 comes in contact with a portion of the $N^+$ source layer 9-1 and a portion of the $P^+$ layer 10. The base of the drain contact 13 comes in contact with a portion of the $N^+$ drain layer 9-2. Then, a source wiring layer 14-1 that comes in contact with the upper surface of the source contact 12, and a drain wiring layer 14-2 that comes in contact with the upper surface of the drain contact 13, are formed on the interlayer insulating film 11. Thus the manufacturing process of the lateral power MOSFET is completed.

Accordance to the first embodiment of the present invention, the N+ source layer 9-1 is formed in the manufacturing step shown in FIG. 6B, and then the P+ layer 10 is formed in the manufacturing step shown in FIG. 6C. However, the order of forming the N+ source layer 9-1 and the P+ layer 10 may be reversed. That is, the P+ layer 10 may be formed in the manufacturing step shown in FIG. 6C, and then the N+ source layer 9-1 may be formed in the manufacturing step shown in FIG. 6B.

According to the first embodiment of the present invention, the p-type body layer 100 of the lateral power MOSFET is comprised of the first region 5 and the second region 8, and the step of forming the first region 5 and the step of forming the second region 8 are separately conducted. In addition, the first region 5 and the second region 8, which comprise the p-type body layer 100, are formed in the ion-implantation step, respectively. However, thermal diffusion treatments are not conducted after the ion-implantation step. In other words, the first region 5 of the p-type body layer 100 is formed without conducting a thermal diffusion treatment of impurities after the first ion-implantation step of selectively implanting the p-type impurity boron (B+) into the n-type offset layer 3. Then, the gate electrode 7 is formed in the gate electrode formation region. After this step, the second ion-implantation step is conducted, which the p-type impurity boron (B+) is selectively implanted into the n-type offset layer 3 by using the gate electrode 7 as a mask. However, the second region 8 of the p-type body layer 100, which is self-aligned with the edge 7-2 of the gate electrode 7, is formed without conducting a thermal diffusion treatment of impurities. Because of this, the p-type body layer 100 is formed, which is comprised of the first region 5 and the second region 8.

The first region 5 of the p-type body layer 100 is formed before the gate electrode 7 is formed. Therefore, it is not necessary to conduct a thermal diffusion step of impurities, which is implanted in the ion-implantation step, in the crosswise direction. It is preferable to conduct a thermal treatment for activating impurities after the ion-implantation step, in order to form the first region 5 of the p-type body layer 100. However, it is important to inhibit the temperature and time in a thermal treatment, so that the thermal diffusion of impurities in the crosswise direction will not be caused. In other words, even if a thermal treatment for activating impurities is conducted in order to form the first region 5 of the p-type body layer 100, this thermal treatment is not conducted at a high temperature for a long period of time. Therefore, the thermal diffusion of impurities, especially the thermal diffusion of impurities in the crosswise direction, will not be caused. Therefore, the interface 120 between the first region 5 of the p-type body layer 100 and the n-type offset layer 3 can be formed to have a substantially vertical slope. The interface 120 is formed to be substantially vertical to the surface of the p-type semiconductor substrate 1. Also, to avoid the thermal diffusion of impurities in the crosswise direction, the thermal treatment for activating impurities does not have to be conducted. Either way, the thermal diffusion of impurities in the crosswise direction will not be caused during the formation the first region 5 of the p-type body layer 100.

After this step, the gate electrode 7 is formed. The edge 7-2 of the gate electrode 7 is defined by the edge 22-1 of the opening 25 of the silicon nitride film 22. On the other hand, the edge of the first region 5 of the p-type body layer 100 is also defined by the edge 22-1 of the opening 25 of the silicon nitride film 22. Therefore, the edge 7-2 of the gate electrode 7 is aligned with the edge of the first region 5 of the p-type body layer 100 in the horizontal position. Therefore, the gate electrode 7 has the edge vicinity region 7-1 that is aligned with the first region 5 of the p-type body layer 100 in the horizontal direction. This means that the first region 5 of the p-type body layer 100 is formed immediately below the edge vicinity region of the gate electrode 7 without conducting a thermal diffusion treatment in the crosswise direction.

On the other hand, the second region 8 of the p-type body layer 100 is formed after the gate electrode 7 is formed. However, the first region 5 of the p-type body layer 100 is formed immediately below the edge vicinity region 7-1 of the gate electrode 7. Therefore, it is not necessary to conduct a thermal diffusion step of impurities, which are implanted in the ion-implantation step, in the crosswise direction. The second region 8 of the p-type body layer 100 is formed in same way as the first region 5. Therefore, it is preferable to conduct a thermal treatment for activating impurities after the ion-implantation step in forming the second region 8 of the p-type body layer 100. However, it is important to inhibit the temperature and time of a thermal treatment so that the thermal diffusion of impurities in the crosswise direction will not be caused. In other words, even if a thermal treatment for activating impurities is conducted in order to form the second region 8 of the p-type body layer 100, this thermal treatment will not be conducted at a high temperature for a long period of time. Therefore, the thermal diffusion of impurities, especially the thermal diffusion of impurities in the crosswise direction, will not be caused. Therefore, the interface 120 between the formed first region 5 of the p-type body layer 100 and the n-type offset layer 3 is formed to have a substantially vertical slope. The interface 120 is formed approximately vertical to the surface of the p-type semiconductor substrate 1. To avoid the thermal diffusion of impurities in the crosswise direction, the thermal treatment for activating impurities does not have to be conducted. Either way, the thermal diffusion of impurities in the crosswise direction will not be caused during the formation of the second region 8 of the p-type body layer 100. Also, the ion-implantation step is conducted in order to form the second region 8 of the p-type body layer 100 by using the edge 7-2 of the gate electrode 7 as a mask. Therefore, the boundary 110 between the first region 5 and the second region 8, which comprise the p-type body layer 100, is self-aligned with the edge 7-2 of the gate electrode 7.

As described above, in forming the first region 5 and the second region 8, which comprise the p-type body layer 100, a thermal diffusion treatment at a high temperature for a long period of time that causes the thermal diffusion of impurities will not be conducted. Therefore, even though the polysilicon comprising the gate electrode 7 includes the n-type impurity, the n-type impurity does not penetrate the gate oxide film 6, and is not thermally diffused into the n-type offset layer 3 and the channel region comprised of the upper region of the first region 5 of the p-type body layer 100 that is located immediately below the gate oxide film 6. Because of this, the device properties are not changed.

Furthermore, the body layer is formed without conducting a thermal diffusion treatment at a high temperature for a long period of time. Because of this, it will be easy to control the formation of the body layer in a desired region. Therefore, it is possible to further miniaturize a device. More specifically, in manufacturing a lateral power MOSFET with the double-diffusion structure, it will be easy to (i) form a substantially vertical interface between the body layer and the offset layer, (ii) control the position of this substantially vertical interface, and (iii) control the impurity concentration profiles in the body layer and the offset layer in the crosswise direction. If a device can be miniaturized, it is possible to reduce the on-state resistance of a device. As a result, it is possible to reduce the power consumption of a device.

Also, because the body layer is formed without conducting a thermal diffusion treatment at a high temperature for a long period of time, it will be possible to reduce the manufacturing time and the manufacturing cost.

In addition, because the body layer is formed without conducting a thermal diffusion treatment at a high temperature for a long time if a lateral power MOSFET and another element are formed on the same substrate, it is possible to reduce the influence of a thermal diffusion treatment at a high temperature for a long period time with respect to this other element.

Second Embodiment

According to the second embodiment of the present invention, in forming a body layer of a lateral power metal-oxide semiconductor field-effect transistor (hereinafter called a lateral power MOSFET), a first region of the body layer, which is located immediately below an edge vicinity region of a gate electrode formation region and adjoins an offset layer, is formed before a gate electrode is formed, and a second region (i.e., the remaining region of the body layer) is formed after the gate electrode is formed. Thus, the body layer can be formed without conducting a thermal diffusion treatment at a high temperature for a long period of time.

In addition, in the above described first embodiment, the first region of the body layer has an even impurity concentration profile. In other words, the upper region of the body layer, which functions as a channel region, and the lower region located below the upper region has the same impurity concentration. However, in the second embodiment of the present invention, a first region of a body layer has an impurity concentration profile in which the impurity concentration varies according to the depth direction. Specifically, the impurity concentration in the shallow region of the first region of the body layer, which functions as a channel region, is low. On the other hand, the impurity concentration in the deep region of the first region of the body region, which is located below the shallow region of the first region, is high. This structure makes it possible to reduce the channel resistance and the threshold voltage of a gate as well as enhance punch-through resistance.

Lateral Power MOSFET Structure

The structural difference between the lateral power MOSFET in accordance with the first embodiment of the present invention and that in accordance with the second embodiment of the present invention is that, in the second embodiment, a first region of a p-type body layer is comprised of a shallow region and a deep region, with the deep region having an impurity concentration that is higher than the impurity concentration of the shallow region. It is necessary to reduce the channel resistance in a channel region of a body layer and the threshold voltage of a gate to enhance the driving capability of a device. It is preferable to design an impurity concentration in a body layer to be low in order to reduce the channel resistance and the threshold voltage of a gate. On the other hand, it is necessary to enhance the punch-through resistance between a source region and an offset region in order to miniaturize a device. It is preferable to design the impurity concentration of a body layer to be high in order to enhance the punch-through resistance. Therefore, it is possible to meet the contradictory demands of enhancement of the driving capability of a device and enhancement of the punch-through resistance by setting the impurity concentration in the shallow region of the first region of the body layer to be low, which functions as a channel region, and by setting the impurity concentration in the deep region except for the channel region to be high. As a result, it is possible to further miniaturize a device. If it is possible to miniaturize a device, it is possible to reduce the on-state resistance of a device. As a result, it is possible to reduce the power consumption of a device. The lateral power MOSFET in accordance with the second embodiment of the present invention has the following structure.

Figure 8:
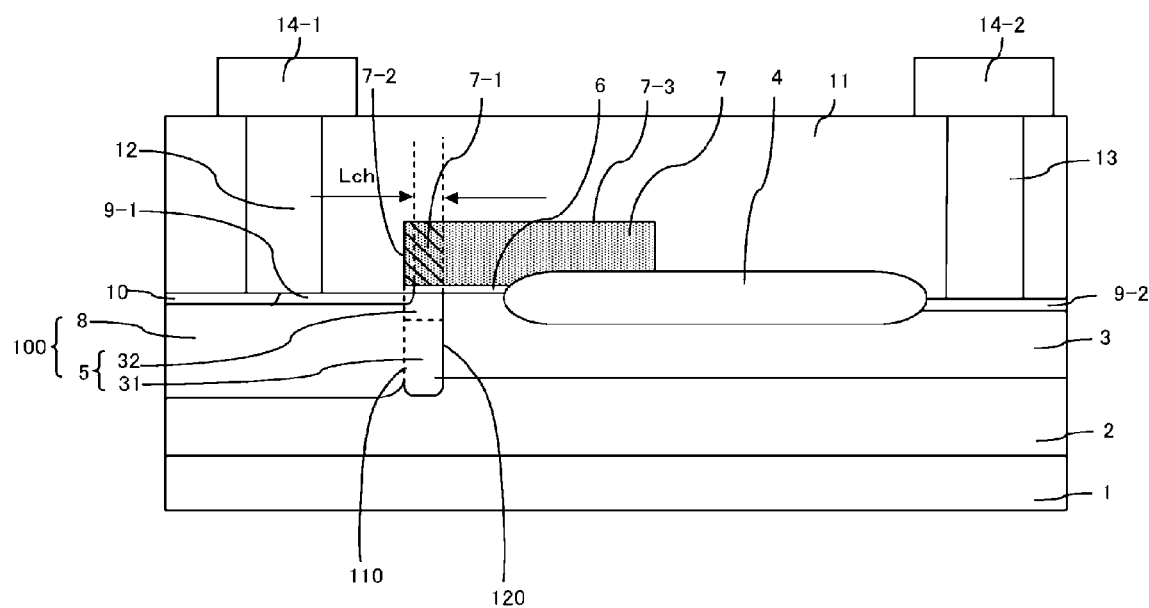
FIG. 8 is a partial vertical cross-section diagram of a lateral power MOSFET structure in accordance with a second embodiment of the present invention.

FIG. 8 is a partial vertical cross-section diagram showing a lateral power MOSFET structure in accordance with the second embodiment of the present invention. An n-type epitaxial layer 2 is formed on a p-type semiconductor substrate 1. An n-type offset layer 3 and a p-type body layer 100 are selectively formed on the n-type epitaxial layer 2. The p-type body layer 100 is comprised of a first region 5 and a second region 8. The first region 5 is formed adjacent to the n-type offset layer 3. The second region 8 is separated from the n-type offset layer 3 through the first region 5. In other words, the first region 5 of the p-type body layer 100 is formed adjacent to the n-type offset layer 3 through a substantially vertical interface 120. The interface 120 is formed to be substantially vertical to the surface of the p-type semiconductor substrate 1. The first region 5 of the p-type body layer 100 comes in contact with the second region 8 of the p-type body layer 100 through a boundary 110. The base of the first region 5 is located slightly below the interface between the n-type offset layer 3 and the n-type epitaxial layer 2.

In addition, the first region 5 of the p-type body layer 100 is comprised of a shallow region 32 and a deep region 31 that is located below this shallow region 32. The deep region 31 has an impurity concentration that is higher than the impurity concentration of the shallow region 32 that includes a channel region. It is possible to keep the punch-through resistance between an N$^+$ source layer 9-1 and the n-type offset layer 3 to be high, because the deep region 31 has a high impurity concentration. Also, the impurity concentration of the shallow region 32 including a channel region is lower than that of the deep region 31, and thus the channel resistance and the threshold voltage of the gate are reduced. Because of this, it is possible to enhance the driving capability of a device. Also, it is important to set the impurity concentration of a channel to be low in order to reduce the channel resistance and the threshold voltage of a gate. Therefore, the depth (i.e., the thickness) of the shallow region 32 may be set so that it includes the channel region. Also, the region that does not function as a channel region is comprised of the deep region 31 with a high impurity concentration. As a result, it is ensured to prevent punch-through between the N$^+$ source layer 9-1 and the n-type offset layer 3.

A P$^+$ layer 10 is formed in a portion of the upper region of the second region 8 of the p-type body layer 100. An N$^+$ source layer 9-1 is formed in a portion of the shallow region 32 of the first region 5 of the p-type body layer 100 and another portion of the upper region of the second region 8 of the p-type body layer 100. The N$^{30}$ source layer 9-1 is separated from the n-type offset layer 3 through the shallow region 32 of the first region 5of the p-type body layer 100. This shallow region 32 functions as a cannel region. The horizontal dimension of this shallow region 32, that is, the horizontal distance between the N$^+$ source layer 9-1 and the n-type offset layer 3, corresponds to a channel length Lch.

A field oxide film 4 is selectively formed on the n-type offset layer 3. An N$^+$ drain layer 9-2 is formed on the n-type offset layer 3. A gate insulating film 6 is formed on the shallow region 32 of the first region 5 of the p-type body layer 100 and a portion of the n-type offset layer 3, which is located adjacent to the shallow region 32 of the first region 5 of the p-type body layer 100. A gate electrode 7 is formed on the gate insulating film 6 and a portion of the field oxide film 4. The gate electrode 7 includes an edge vicinity region 7-1, an edge 7-2, and a planarized upper surface 7-3. The edge vicinity region 7-1 of the gate electrode 7 is formed immediately above the shallow region 32 of the first region 5 of the p-type body layer 100. In other words, the edge vicinity region 7-1 is self-aligned with the first region 5 of the p-type body layer 100 in the horizontal position. Also, the edge 7-2 of the gate electrode 7 is self-aligned with the boundary 110 between the first region 5 and the second region 8, which comprise the p-type body layer 100, in the horizontal position. The edge vicinity region 7-1 of the gate electrode 7 is separated and electrically isolated from the p-type body layer 100 through a portion of the gate insulating film 6. The gate electrode 7 is separated and electrically isolated from the n-type offset layer 3 through the gate insulating film 6 and the field oxide film 4.

An interlayer insulating film 11 is formed on the P⁺ layer 10, the N⁺ source layer 9-1, the gate electrode 7, the field oxide film 4, and the N⁺ drain layer 9-2. The interlayer insulating film 11 has a source contact hole and a drain contact hole. A source contact 12 is formed in the source contact hole. A drain contact 13 is formed in the drain contact hole. The base of the source contact 12 comes in contact with a portion of the N⁺ source layer 9-1 and a portion of the P⁺ layer 10. The N⁺ source layer 9-1 and the P⁺ layer 10 have a high impurity concentration, respectively, so that they can have an ohmic contact with the source contact 12. The base of the drain contact 13 comes in contact with a portion of the N⁺ drain layer 9-2. The N⁺ drain layer 9-2 has a high impurity concentration so that it can have an ohmic contact with the drain contact 13. A source wiring layer 14-1 and a drain wiring layer 14-2 are formed on the interlayer insulating film 11. The source wiring layer 14-1 is electrically connected to the N⁺ source layer 9-1 and the P⁺ layer 10 through the source contact 12. The drain wiring layer 14-2 is electrically connected to the N⁺ drain layer 9-2 through the drain contact 13. Also, the above described thickness of each layer and the above described concentration are not necessarily limited, and they can be arbitrarily designed with heretofore known design techniques.

The following are the main differences between the structure of heretofore known lateral MOSFETs and that of the lateral power MOSFET in accordance with the present invention.

As described above, the p-type body layer 100 is comprised of the first region 5 and the second region 8. Here, the first region 5 is formed adjacent to the n-type offset layer 3 and the second region 8 is separated from the n-type offset layer 3 through the first region 5. In addition, the boundary 110 between the first region 5 and the second region 8 is formed approximately vertical to the surface of the p-type semiconductor substrate 1. Also, the interface 120 between the first region 5 and the n-type offset layer 3 is substantially vertical. The interface 120 is also formed to be substantially vertical to the surface of the p-type semiconductor substrate 1. In addition, the edge 7-2 of the gate electrode 7 is aligned with the boundary 110 between the first region 5 and the second region 8, which comprise the p-type body layer 100, in the horizontal position. Also, the gate electrode 7 has the planarized upper surface 7-3.

Also, as described above, the first region 5 of the p-type body layer 100 is comprised of the shallow region 32 that includes a channel region and the deep region 31 located below this shallow region 32, which has an impurity concentration that is higher than the impurity concentration of the shallow region 32.

Method for Manufacturing Lateral Power MOSFET

The above described structural differences between the heretofore known lateral MOSFET and the lateral MOSFET in accordance with the present invention are attributed to a manufacturing process of the lateral power MOSFET in accordance with the present invention. Referring now to the drawings, the method for manufacturing the lateral power MOSFET in accordance with the present invention will be described in detail.

FIGS. 9A to 9C, 10A to 10C, 11A to 11C, 12A to 12C, 13A to 13C, and 14 are partial vertical cross-section diagrams showing a manufacturing process of the lateral power MOSFET in accordance with the second embodiment of the present invention.

Figure 9A:
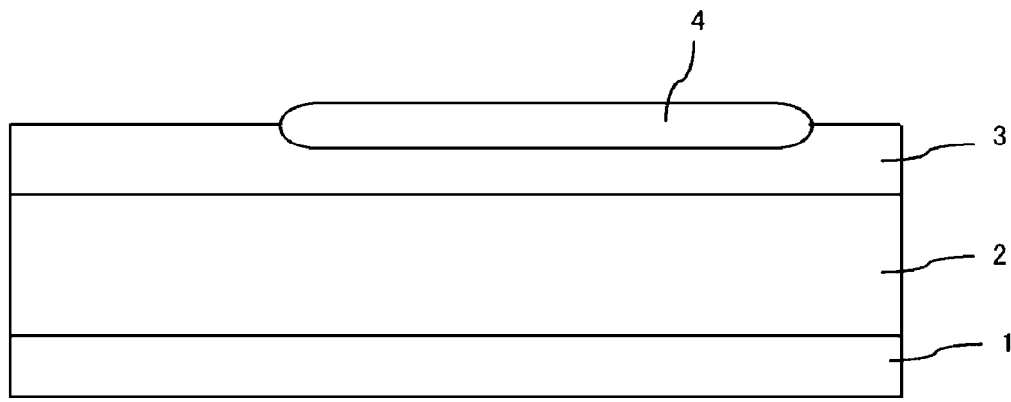
FIGS. 9A to 9C are partial vertical cross-section diagram of a lateral power MOSFET structure in accordance with the second embodiment of the present invention.

As shown in FIG. 9A, an n-type epitaxial layer 2 of 5 μm in thickness is formed on a p-type semiconductor substrate 1 (or a p-type silicon substrate 1). Then, the n-type impurity phosphorus (P⁺) is implanted into an upper region of the n-type epitaxial layer 2 with an acceleration energy of 150 keV and a dose amount of $1.0 \times 10^{13}$ cm$^{-2}$. Then, an n-type offset layer 3 is formed in the upper region of the n-type epitaxial layer 2 by conducting a thermal treatment at approximately 950 degrees Celsius for 30 minutes. Then, a field oxide film 4 is formed on the n-type offset layer 3 with the local oxidation silicon (LOCOS) method.

Figure 9B:
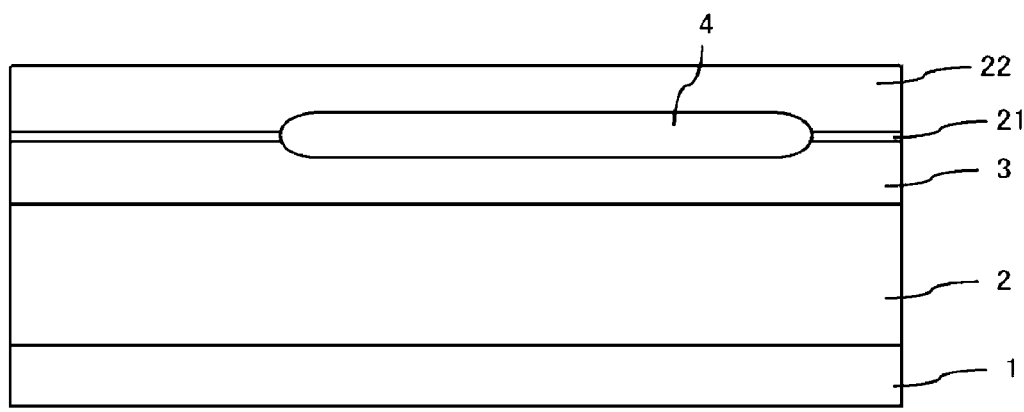

As shown in FIG. 9B, a silicon dioxide film 21 of 20 nm in thickness is formed on the n-type offset layer 3 with the thermal oxidation method. Next, a silicon nitride film 22 of 300 nm in thickness is formed on the silicon dioxide film 21 with the chemical vapor deposition (CVD) method.

Figure 9C:
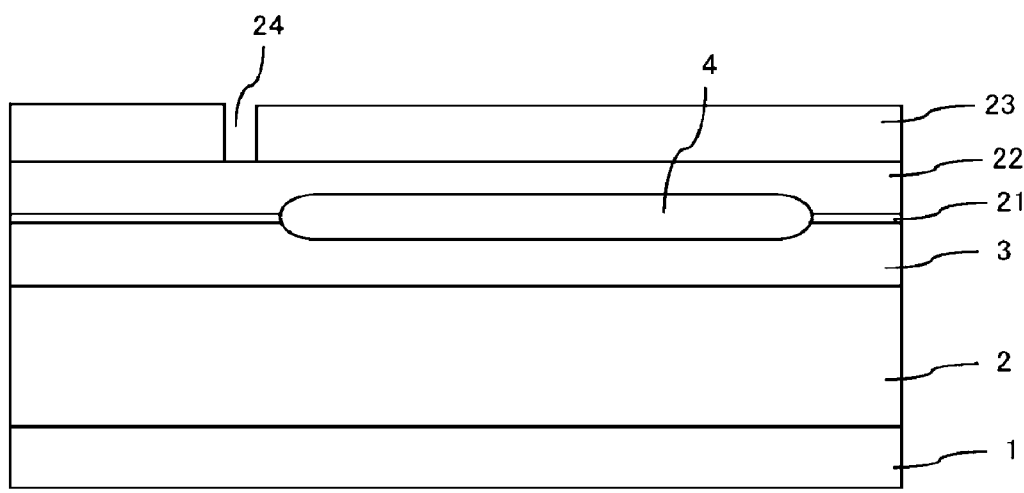

As shown in FIG. 9C, a resist film is applied to the upper surface of the silicon nitride film 22, and exposure and development are conducted with respect to the resist film. As a result, a resist pattern 23 is formed in which an opening 24 of 300 nm in width is formed in a first selected region.

Figure 10A:
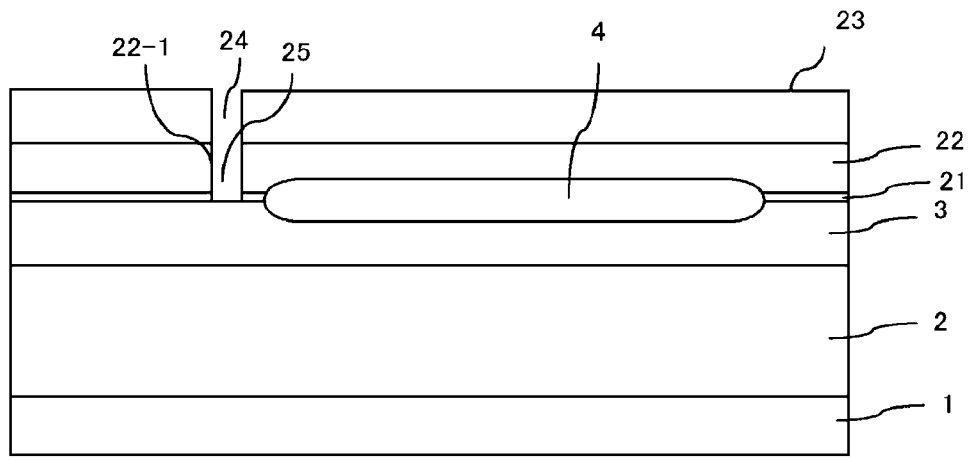
FIGS. 10A to 10C are partial vertical cross-section diagram of a lateral power MOSFET structure in accordance with the second embodiment of the present invention.

As shown in FIG. 10A, anisotropic etching is conducted by using the resist pattern 23 in which the opening 24 of 300 nm in width is formed as a mask. Thus, a portion of the silicon nitride film 22 and a portion of the silicon dioxide film 21, both of which are located immediately below the opening 24, are selectively eliminated. As a result, an opening 25 of 300 nm in width, which penetrates the silicon nitride film 22 and the silicon dioxide film 21, is formed. Also, this opening 25 has an edge 22-1.

Figure 10B:
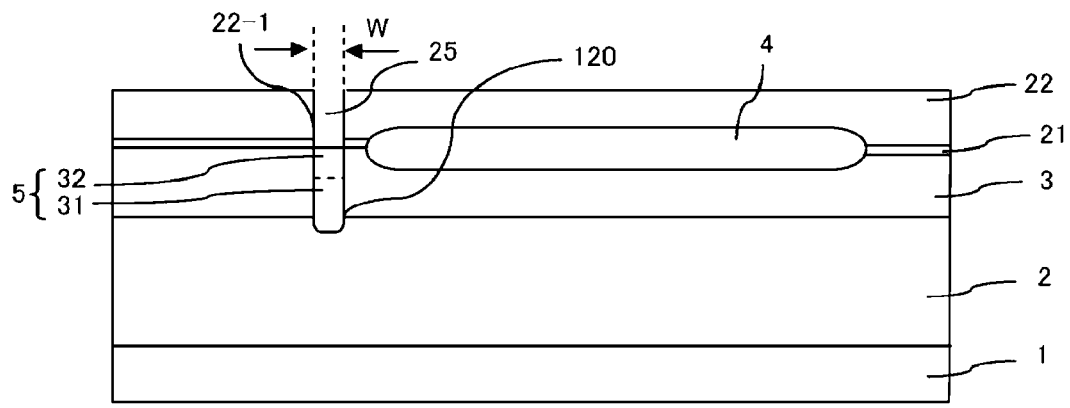

As shown in FIG. 10B, the resist pattern 23 is eliminated. Then, the p-type impurity boron (B⁺) is ion-implanted into the n-type offset layer 3 and the upper surface vicinity region of the n-type epitaxial layer 2 by using the silicon nitride film 22 and the silicon dioxide film 21, both of which have the opening 25 of 300 nm in width as a mask, with an acceleration energy 200 keV and a dose amount of $1 \times 10^{14}$ cm$^{-2}$. Then, the p-type impurity boron (B⁺) is implanted into the shallow region of the n-type offset region 3 by using the silicon nitride film 22 having the opening 25 of 300 nm in width and the silicon oxide film 21 as masks with an acceleration energy of 50 keV and a dose amount of $1.0 \times 10^{13}$ cm$^{-2}$. Next, a thermal treatment is conducted at approximately 960 degrees Celsius for 30 minutes, and the implanted impurities are activated. As a result, a first region 5, which is comprised of a shallow region 32 and a deep region 31 that is located below this shallow region 32 and has an impurity concentration that is higher than the impurity concentration of this shallow region 32, is selectively formed in the n-type offset layer 3 and the upper vicinity region of the n-type epitaxial layer 2.

In other words, the first region 5 is comprised of the shallow region 32 including a channel region and the deep region located below this shallow region 32. The deep region 31 has an impurity concentration that is higher than the impurity concentration of the shallow region 32 that includes a channel region. As described below, it is possible to keep the punch-through resistance between an $N^+$ source layer 9-1 and the n-type offset layer 3 to be high, because the deep region 31 has a high impurity concentration. In addition, the shallow region 32 including a channel region has an impurity concentration that is lower than the impurity concentration of the deep region 31, and thus the channel resistance and the threshold voltage of a gate are reduced. Therefore, it is possible to enhance the driving capability of a device. Also, it is important to set the impurity concentration of a channel region to be low in order to reduce the channel resistance and the threshold voltage of a gate. Therefore, the depth (i.e., the thickness) of the shallow region 32 may be set so that it includes a channel region. Also, the region that does not function as a channel region is comprised of the deep region 31 with a high impurity concentration. As a result, it is ensured to prevent punch-through between the $N^+$ source layer 9-1 and the n-type offset layer 3.

The base of the first region 5 is located slightly below the interface between the n-type offset layer 3 and the n-type epitaxial layer 2. The edge of the first region 5 is self-aligned with the edge 22-1 of the opening 25 in the horizontal position. It is important that the thermal diffusion of impurities, especially the thermal diffusion in the crosswise direction, is not caused in the thermal treatment performed at approximately 950 degrees Celsius for 30 minutes. In other words, it is preferable to conduct a thermal treatment for activating impurities in order to form the first region 5, but it is important to inhibit the temperature and time in a thermal treatment so that the thermal diffusion of impurities in the crosswise direction will not be caused. Even if a thermal treatment for activating impurities in order to form the first region 5 is conducted, the thermal diffusion of impurities, especially the thermal diffusion of impurities in the crosswise direction, will not be caused because this thermal treatment is not conducted at a high temperature for a long period of time. Therefore, an interface 120 between the first region 5 and the n-type offset layer 3 can be formed to have a substantially vertical slope. The interface 120 is formed to be substantially vertical to the surface of the p-type semiconductor substrate 1. Also, to avoid the thermal diffusion of impurities in the crosswise direction, the thermal treatment for activating impurities does not have to be conducted. But either way, the thermal diffusion of impurities in the crosswise direction will not be caused during the formation of the first region 5. Because of this, a width W of the first region 5 is defined by the width of the opening 25. Therefore, the width W of the first region 5 is formed to be 300 nm.

Figure 10C:
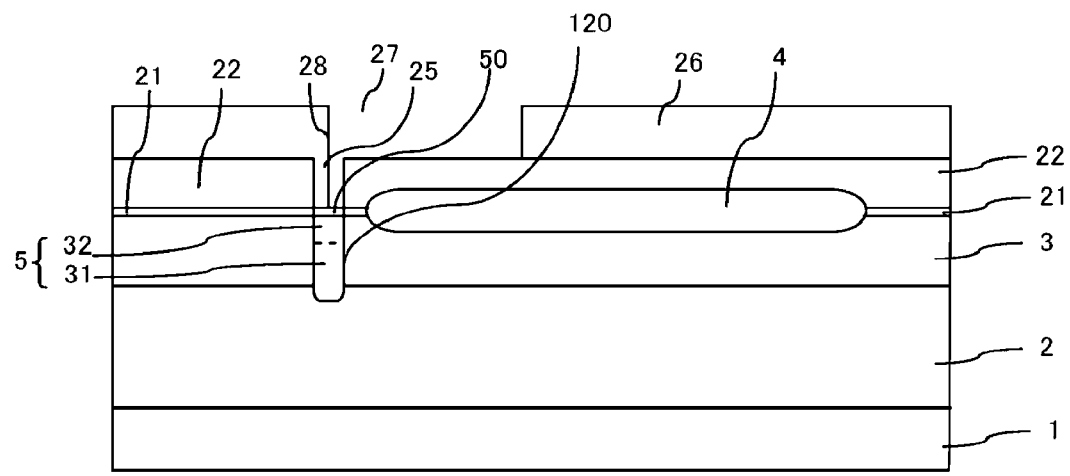

As shown in FIG. 10C, the exposed surface of the first region 5 located immediately below the opening 25 is oxidized by the thermal oxidization method. Thus, a silicon dioxide film 50 of 20 nm in thickness is formed. After this, a resist film is applied to the upper surface of the silicon nitride film 22 and the inside of the opening 25, and this resist is exposed and developed. Thus, a resist pattern 26 will be formed in which an opening 27 is formed in a second selected region. An edge 28 of the opening 27 formed in the resist pattern 26 must be located within the first region 5 in the horizontal position. Therefore, for the purpose of maximizing the latitude of the alignment accuracy with respect to the edge 28 of the opening 27 formed in the resist pattern 26, it is preferable to conduct a patterning for the resist film so that the edge 28 of the opening 27 formed in the resist pattern 26 is aligned in the middle of the first region 5 in the horizontal position. In this case, the above described latitude of the alignment accuracy can be set to half of the width of the first region 5 (i.e., half of 300 nm). As a result, the silicon dioxide film 50 is partially covered with the resist pattern 26.

Figure 11A:
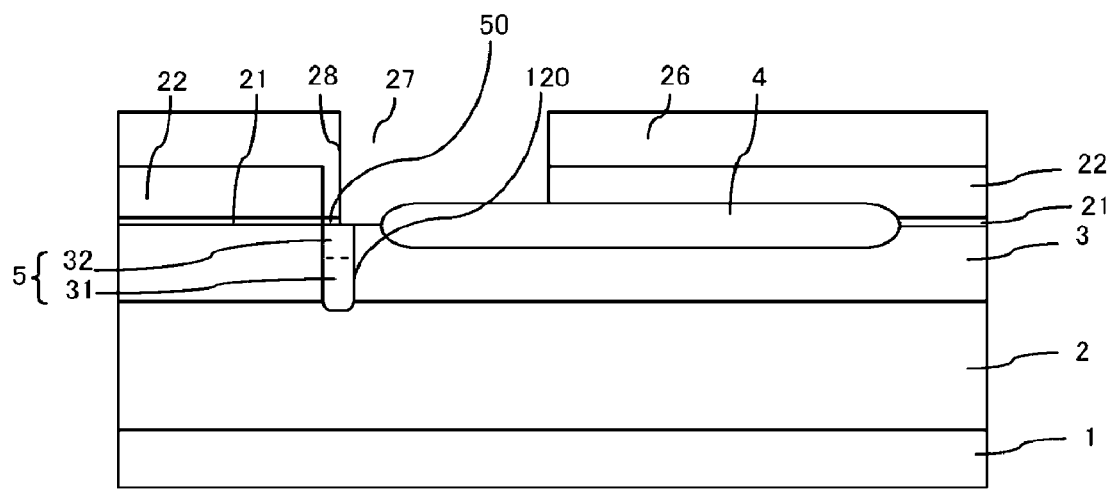
FIGS. 11A to 11C are partial vertical cross-section diagram of a lateral power MOSFET structure in accordance with the second embodiment of the present invention.

As shown in FIG. 11A, a portion of the silicon nitride film 22, a portion of the silicon dioxide film 21, and a portion of a silicon dioxide film 50, which are located immediately below the opening 27 formed in the resist pattern 26 and not covered by the resist pattern 26, are selectively eliminated with the anisotropic etching by using the resist pattern 26 as a mask. Thus, a portion of the upper surface of the first region 5 and a portion of the upper surface of the n-type offset layer 3 are exposed.

Figure 11B:
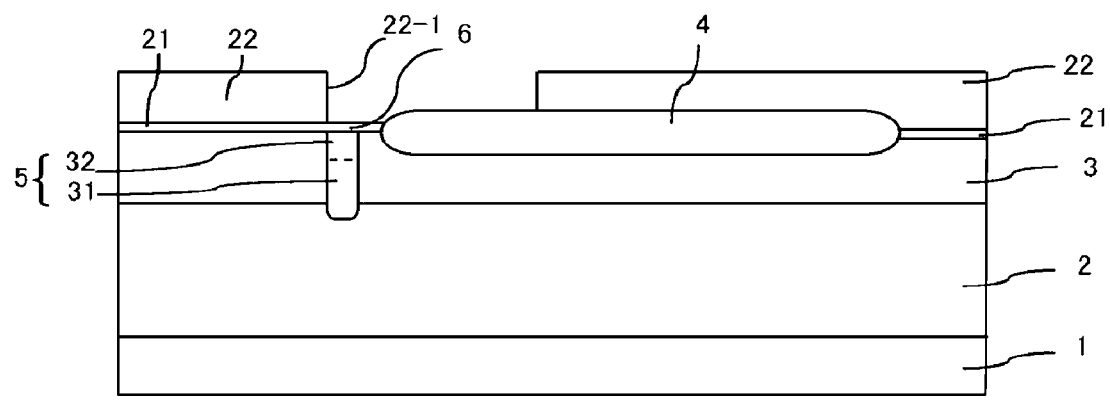

As shown in FIG. 11B, the resist pattern 26 is eliminated. In addition, the remaining portion of the silicon dioxide film 50, which was covered by the resist pattern 26, is eliminated. Then, a gate oxide film 6 of 20 nm in thickness is formed on the exposed upper surface of the first region 5 and the exposed upper surface of the n-type offset layer 3 with the thermal oxidization method.

Figure 11C:
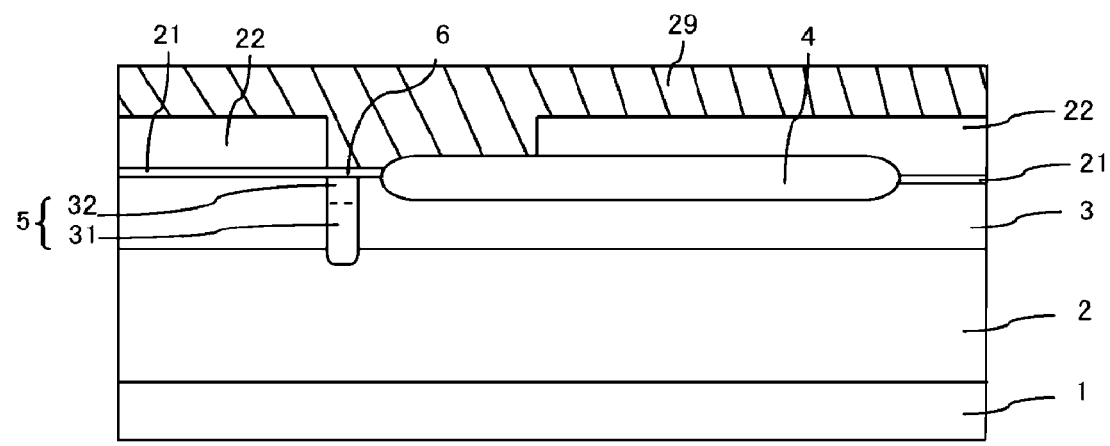

As shown in FIG. 11C, an n-type polysilicon film 29 including n-type impurities is deposited on the silicon nitride film 22, the field oxide film 4, and the gate oxidization film 6 with the chemical vapor deposition (CVD) method. Thus the n-type polysilicon film 29 is completely implanted into the opening 27 formed in the silicon nitride film 22.

Figure 12A:
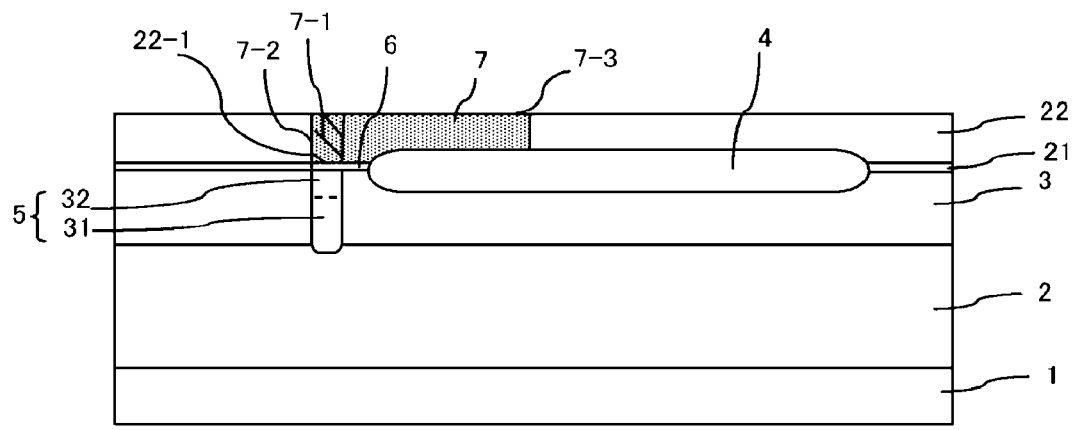
FIGS. 12A to 12C are partial vertical cross-section diagram of a lateral power MOSFET structure in accordance with the second embodiment of the present invention.

As shown in FIG. 12A, elimination of the n-type polysilicon film 29 is conducted by the chemical mechanical polishing (CMP) method until the upper surface of the n-type polysilicon film 29 is vertically aligned with the upper surface of the silicon nitride film 22. Thus, a gate electrode 7 comprised of an n-type polysilicon of 300 nm in thickness is formed. As a result of the CMP method, the gate electrode 7 has a planarized upper surface 7-3. Here, an edge 7-2 of the gate electrode 7 is defined by the edge 22-1 of the silicon nitride film 22. On the other hand, as described above in reference to FIG. 10B, the edge of the first region 5 is defined by the edge 22-1 of the opening 25 formed in the silicon nitride film 22. Therefore, the edge 7-2 of the gate electrode 7 is aligned with the edge of the first region 5 in the horizontal position. Therefore, the gate electrode 7 has an edge vicinity region 7-1 that is aligned with the first region 5 in the horizontal position. This means that the first region 5 is formed immediately below the edge vicinity region 7-1 of the gate electrode 7 without conducting a thermal diffusion treatment in the crosswise direction.

Figure 12B:
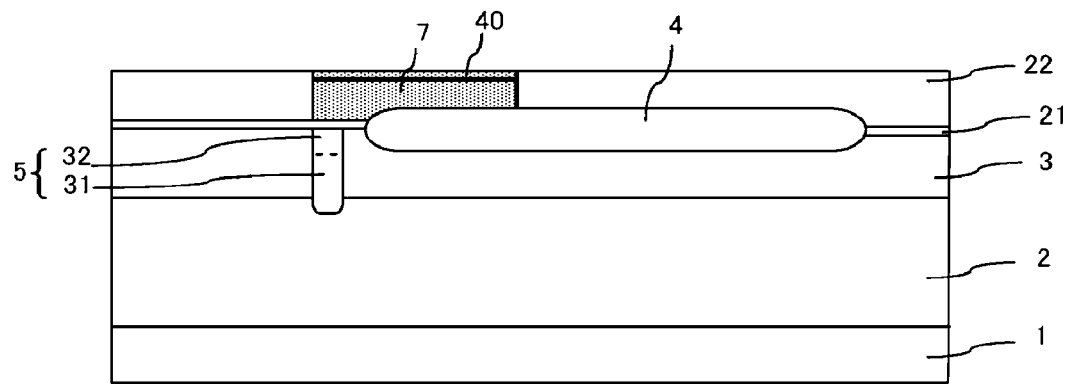

As shown in FIG. 12B, a silicon dioxide film 40 of 20 nm in thickness is formed in the upper portion of the gate electrode 7 comprised of an n-type polysilicon with the thermal oxidization method.

Figure 12C:
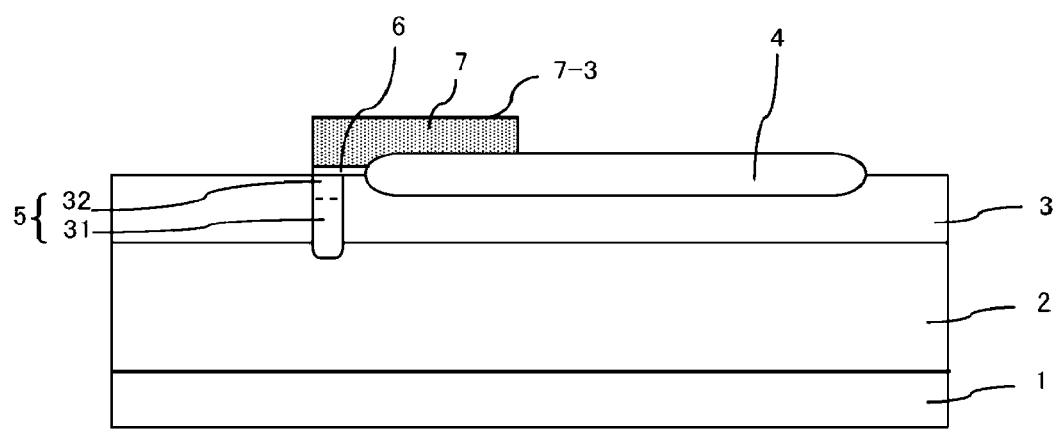

As shown in FIG. 12C, the silicon nitride film 22 and the silicon dioxide film 21 are sequentially eliminated with the wet etching method. Thus the upper surface of the n-type offset layer 3 is exposed. In this wet etching step, the silicon dioxide film 40 formed in the upper portion of the gate electrode 7 is eliminated, and the gate electrode 7 is prevented from being eliminated. As a result, the planarized upper surface 7-3 of the gate electrode 7 is exposed.

Figure 13A:
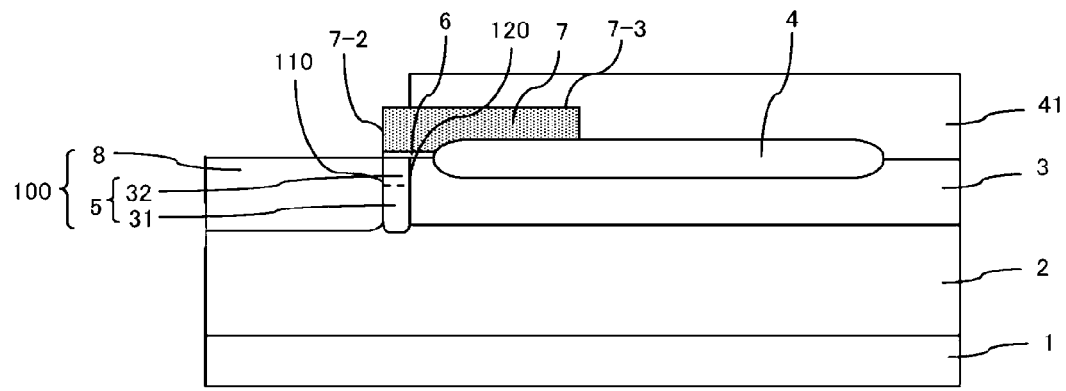
FIGS. 13A to 13C are partial vertical cross-section diagram of a lateral power MOSFET structure in accordance with the second embodiment of the present invention.

As shown in FIG. 13A, a resist film is applied to the upper surfaces of the field oxide film 4, the gate electrode 7, and the n-type offset layer 3, and this resist film is exposed and developed. Thus a resist pattern 41 is formed, which covers a portion of the planarized upper surface 7-3 of the gate electrode 7, the field oxide film 4, and the exposed upper surface of the n-type offset layer 3 on the drain side. Then, the p-type impurity boron ($B^+$) is implanted into the n-type offset layer 3 and the upper vicinity region of the epitaxial layer 2 by using the resist pattern 41 and the edge vicinity region 7-1 as a mask with an acceleration energy of 150 keV and a dose amount of $5\times10^{13}$ cm$^{-2}$. Then, a thermal treatment is conducted at approximately 950 degrees Celsius for 30 minutes, and the implanted impurities are activated. Thus, a second region 8 is selectively formed. As a result, a p-type body layer 100 comprised of the first region 5 and the second region 8 is formed.

The base of the second region 8 of the p-type body layer 100 is formed slightly below the interface between the n-type offset layer 3 and the n-type epitaxial layer 2. It is important that the thermal diffusion of impurities, especially the thermal diffusion in the crosswise direction, is not caused during the thermal treatment performed at approximately 950 degrees Celsius for 30 minutes. In other words, it is preferable to conduct a thermal treatment for activating impurities in order to form the second region 8 of the p-type body layer 100, but it is important to inhibit the temperature and time in a thermal treatment for activating the impurities in the second region 8, so that the thermal diffusion of impurities in the formed first region 5 of the p-type body layer 100 in the crosswise direction will not be caused. Even if a thermal treatment for activating impurities in order to form the second region 8 of the p-type body layer 100 is conducted, the thermal diffusion of impurities in the formed first region 5 of the p-type body layer 100, especially the thermal diffusion of impurities in the crosswise direction will not be caused because this thermal treatment is not conducted at a high temperature for a long period of time. Therefore, the interface 120 between the first region 5 of the p-type body layer 100 and the n-type offset layer 3 can be formed to have a substantially vertical slope. The interface 120 is formed to be substantially vertical to the surface of the p-type semiconductor substrate 1. Also, to avoid the thermal diffusion of impurities in the crosswise direction, the thermal treatment for activating impurities does not have to be conducted. Also, the ion-implantation step is conducted by using the resist pattern 41 and the edge vicinity region 7-1 as masks. Therefore, the boundary 110 between the first region 5 and the second region 8, which comprise the p-type body layer 100, is self-aligned with the edge 7-2 of the gate electrode 7.

As described above, the above described thermal treatment for activating impurities in the second region 8 of the p-type body layer 100 is not a thermal diffusion treatment at a high temperature for a long period of time, which causes the thermal diffusion of impurities. Therefore, even though the polysilicon comprising the gate electrode 7 includes the n-type impurity, this n-type impurity does not penetrate the gate oxide film 6 because of the thermal diffusion, and it is not thermally diffused into the n-type offset layer 3 and a channel region included in the shallow region 32 of the first region 5 of the p-type body layer 100, which is formed immediately below the gate oxide film 6. Therefore, the device properties are not changed.

Figure 13B:
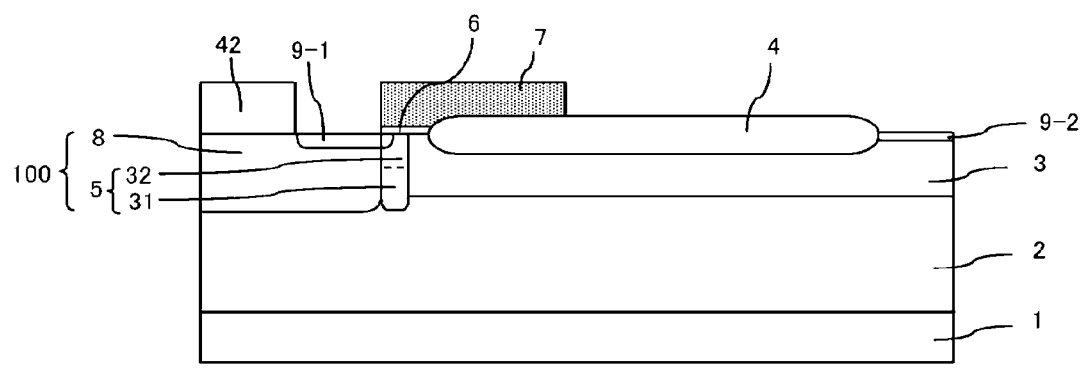

As shown in FIG. 13B, the resist pattern 41 is eliminated. Then, a resist film is applied to the upper surfaces of the second region 8 of the p-type body layer 100, the gate electrode 7, the field oxide film 4, and the n-type offset layer 3, and the resist film is exposed and developed. Thus a resist pattern 42 is formed, which covers a portion of the second region 8 except the portion of the second region 8 located adjacent to the first region 5. Then, the n-type arsenic (As$^+$) is implanted in the upper vicinity region of the second region 8 of the p-type body layer 100 and the upper vicinity region of the n-type offset layer 3 by using the resist pattern 42 as a mask with an acceleration energy of 50 keV and a dose amount of $5\times10^{15}$ cm$^{-2}$. Next, a thermal treatment is conducted at approximately 950 degrees Celsius for 30 minutes, and the implanted impurities are activated. Thus an N$^+$ source layer 9-1 and an N$^+$ drain layer 9-2 are formed in the upper vicinity region of the second region 8 of the p-type body layer 100 and the upper vicinity region of the n-type offset layer 3, respectively.

Figure 13C:
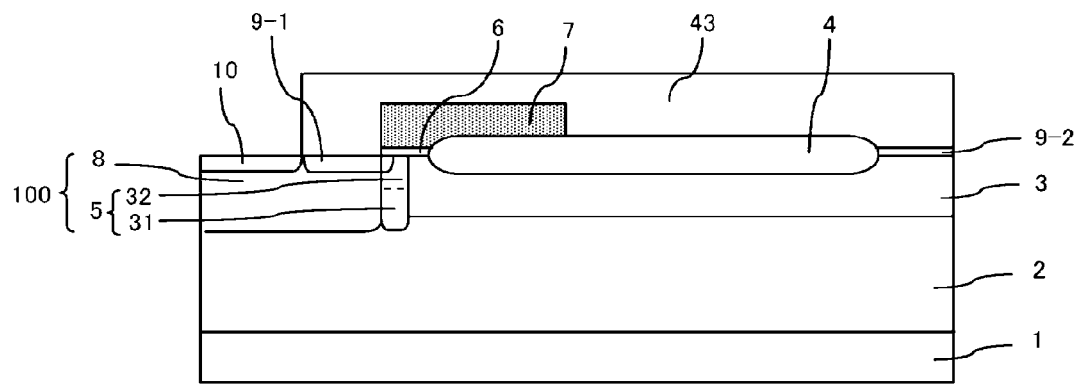

As shown in FIG. 13C, the resist pattern 42 is eliminated. Then, a resist film is applied to the exposed upper surface of the second region 8 of the p-type body layer 100, the exposed upper surface of the N$^+$ source layer 9-1, the exposed surface of the gate electrode 7, the exposed upper surface of the field oxide film 4, and the exposed upper surface of the N$^+$ drain layer 9-2, and the resist film is exposed and developed. Thus a resist pattern 43 is formed, which covers the upper surface of the N$^+$ source layer 9-1, the gate electrode 7, the field oxide film 4, and the N+ drain layer 9-2. Then, the n-type impurity boron difluoride (BF$_2^+$) is implanted into the upper vicinity region of the second region 8 of the p-type body layer 100 by using the resist pattern 43 as a mask with an acceleration energy of 50 keV and a dose amount of $5\times10^{15}$ cm$^{-2}$. Next, a thermal treatment is conducted at approximately 950 degrees Celsius for 30 minutes and the implanted impurities are activated. Thus a P$^+$ layer 10 is formed.

Figure 14:
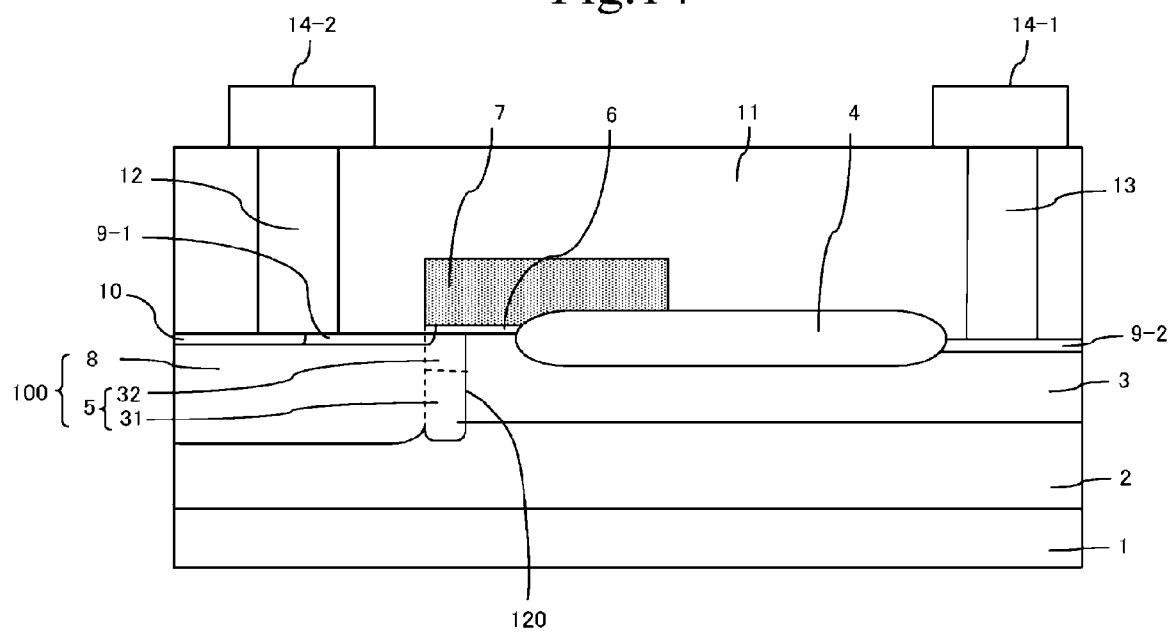
FIG. 14 is a partial vertical cross-section diagram of a lateral power MOSFET structure in accordance with the second embodiment of the present invention.

As shown in FIG. 14, the resist pattern 43 is eliminated. Then, an interlayer insulating film 11 is formed on the P$^+$ layer 10, the N$^+$ source layer 9-1, the gate electrode 7, the field oxide film 4, and the N$^+$ drain layer 9-2. Next, a source contact hole and a drain contact hole are formed in the interlayer insulating film 11 with a heretofore known method. A source contact 12 and a drain contact 13 are formed in the source contact hole and the drain contact hole, respectively. The base of the source contact 12 comes in contact with a portion of the N$^+$ source layer 9-1 and a portion of the P$^+$ layer 10. The base of the drain contact 13 comes in contact with a portion of the N$^+$ drain layer 9-2. Then, a source wiring layer 14-2 that comes in contact with the upper surface of the source contact 12 and a drain wiring layer 14-1 that comes in contact with the upper surface of the drain contact 13 are formed on the interlayer insulating film 11. Thus, the manufacturing process of the lateral power MOSFET is completed.

In accordance with the second embodiment of the present invention, the N$^+$ source layer 9-1 is formed in the manufacturing step shown in FIG. 13B, and then the P$^+$ layer 10 is formed in the manufacturing step shown in FIG. 13C. However, the order of forming the N$^+$ source layer 9-1 and the P$^+$ layer 10 may be reversed. That is, the P$^+$ layer 10 may be formed in the manufacturing step shown in FIG. 13C, and then the N$^+$ source layer 9-1 may be formed in the manufacturing step shown in FIG. 13B.

According to the second embodiment of the present invention, the p-type body layer 100 of the lateral power MOSFET is comprised of the first region 5 and the second region 8, and the step of forming the first region 5 and the step of forming the second region 8 are separately conducted. In addition, the first region 5 and the second region 8, which comprise the p-type body layer 100, are formed in the ion-implantation step of impurities, respectively. However, thermal diffusion treatments are not conducted after the ion-implantation step. In other words, the first region 5 of the p-type body layer 100 is formed without conducting a thermal diffusion treatment of impurities after the first ion-implantation step of selectively implanting the p-type impurity boron (B$^{30}$) into the n-type offset layer 3. Then, the gate electrode 7 is formed in the gate electrode formation region. After this step, the second ion-implantation step is conducted, in which the p-type impurity boron (B$^+$) is selectively implanted into the n-type offset layer 3 by using the gate electrode 7 as a mask. However, the second region 8 of the p-type body layer 100, which is self-aligned with the edge 7-2 of the gate electrode 7, is formed without conducting a thermal diffusion treatment of impurities. Because of this, the p-type body layer 100 is formed, which is comprised of the first region 5 and the second region 8.

The first region 5 of the p-type body layer 100 is formed before the gate electrode 7 is formed. Therefore, it is not necessary to conduct a thermal diffusion step in which the impurities implanted in the ion-implantation step, are diffused in the crosswise direction. It is preferable to conduct a thermal treatment for activating impurities after the ion-implantation step, in order to form the first region 5 of the p-type body layer 100. However, it is important to inhibit the temperature and time in a thermal treatment, so that the thermal diffusion of impurities in the crosswise direction will not be caused. In other words, even if a thermal treatment for activating impurities is conducted in order to form the first region 5 of the p-type body layer 100, this thermal treatment will not be conducted at a high temperature for a long period of time. Therefore, the thermal diffusion of impurities, especially the thermal diffusion of impurities in the crosswise direction, will not be caused. Therefore, the interface 120 between the first region 5 of the p-type body layer 100 and the n-type offset layer 3 can be formed to have a substantially vertical slope. The interface 120 is formed to be substantially vertical to the surface of the p-type semiconductor substrate 1. Also, to avoid the thermal diffusion of impurities in the crosswise direction, the thermal treatment for activating impurities does not have to be conducted. But either way, the thermal diffusion of impurities in the crosswise direction will not be caused during the formation of the first region 5 of the p-type body layer 100.

After this step, the gate electrode 7 is formed. The edge 7-2 of the gate electrode 7 is defined by the edge 22-1 of the opening 25 of the silicon nitride film 22. On the other hand, the edge of the first region 5 of the p-type body layer 100 is also defined by the edge 22-1 of the opening 25 of the silicon nitride film 22. Therefore, the edge 7-2 of the gate electrode 7 is aligned with the edge of the first region 5 of the p-type body layer 100 in the horizontal position. Therefore, the gate electrode 7 has the edge vicinity region 7-1 that is aligned with the first region 5 of the p-type body layer 100 in the horizontal direction. This means that the first region 5 of the p-type body layer 100 is formed immediately below the edge vicinity region of the gate electrode 7 without conducting a thermal diffusion treatment in the crosswise direction.

On the other hand, the second region 8 of the p-type body layer 100 is formed after the gate electrode 7 is formed. However, the first region 5 of the p-type body layer 100 is formed immediately below the edge vicinity region 7-1 of the gate electrode 7. Therefore, it is not necessary to conduct a thermal diffusion step of impurities, which are implanted in the ion-implantation step, in the crosswise direction. The second region 8 of the p-type body layer 100 is formed in the way that is similar to the way of forming the first region 5. Therefore, it is preferable to conduct a thermal treatment for activating impurities after the ion-implantation step in forming the second region 8 of the p-type body layer 100. However, it is important to inhibit the temperature and time of a thermal treatment so that the thermal diffusion of impurities in the crosswise direction will not be caused. In other words, even if a thermal treatment for activating impurities is conducted in order to form the second region 8 of the p-type body layer 100, this thermal treatment is not conducted at a high temperature for a long period of time. Therefore, the thermal diffusion of impurities, especially the thermal diffusion of impurities in the crosswise direction, will not be caused. Therefore, the interface 120 between the formed first region 5 of the p-type body layer 100 and the n-type offset layer 3 is formed to have a substantially vertical slope. The interface 120 is formed to be substantially vertical to the surface of the p-type semiconductor substrate 1. To avoid the thermal diffusion of impurities in the crosswise direction, the thermal treatment for activating impurities does not have to be conducted. Either way, the thermal diffusion of impurities in the crosswise direction is not caused in forming the second region 8 of the p-type body layer 100. Also, the ion-implantation step is conducted in order to form the second region 8 of the p-type body layer 100 by using the edge 7-2 of the gate electrode 7 as a mask. Therefore, the boundary 110 between the first region 5 and the second region 8 which comprise the p-type body layer 100 is self-aligned with the edge 7-2 of the gate electrode 7.

As described above, in forming the first region 5 and the second region 8, which comprise the p-type body layer 100, a thermal diffusion treatment is not conducted at a high temperature for a long period of time, which causes the thermal diffusion of impurities. Therefore, even though the polysilicon comprising the gate electrode 7 includes the n-type impurity, the n-type impurity does not penetrate the gate oxide film 6 and is not thermally diffused into the n-type offset layer 3 and the channel region comprised of the upper region of the first region 5 of the p-type body layer 100 that is located immediately below the gate oxide film 6. Because of this, the device properties are not changed.

Furthermore, the body layer is formed without conducting a thermal diffusion treatment at a high temperature for a long period of time. Because of this, it will be easy to control the formation of the body layer in a desired region. Therefore, it is possible to further miniaturize a device. More specifically, in manufacturing a lateral power MOSFET with the double-diffusion structure, it will be easy to (i) form a substantially vertical interface between the body layer and the offset layer, (ii) control the position of this substantially vertical interface, and (iii) control the impurity concentration profiles in the body layer and the offset layer in the crosswise direction. If a device can be miniaturized, it will be possible to reduce the on-state resistance of a device. As a result, it will be possible to reduce the power consumption of a device.

In addition, the body layer is formed without conducting a thermal diffusion treatment at a high temperature for a long period of time. Therefore, it is possible to reduce the manufacturing time and the manufacturing cost.

Furthermore, the body layer is formed without conducting a thermal diffusion treatment at a high temperature for a long period of time. Therefore, if a lateral power MOSFET and another element are formed on the same substrate, it is possible to reduce the influence of a thermal diffusion treatment at a high temperature for a long time with respect to this other element.

Also, the first region 5 of the p-type body layer 100 is comprised of the shallow region 32 including a channel region and the deep region that is located below this shallow region 32. The deep region 31 has an impurity concentration that is higher than the impurity concentration of the shallow region 32 including a channel region. It is necessary to reduce the threshold voltage of a gate and the channel resistance of the channel region included in the shallow region 32 of the first region 5 of the p-type body layer 100 in order to enhance the driving capability of a device. It is preferable to design the impurity concentration of the shallow region 32 of the first region 5 of the p-type body layer 100 to be low in order to reduce the threshold voltage of a gate and the channel resistance. On the other hand, it is necessary to enhance the punch-through resistance between the $N^+$ source layer 9-1 and the n-type offset layer 3 in order to miniaturize a device. It is preferable to design the impurity concentration of the deep region 31 of the p-type body layer 100, which is located below the shallow region 32 including the channel region, to be high in order to enhance the punch-through resistance. Therefore, it is possible to meet the contradictory demands of enhancement of the driving capability of a device and enhancement of the punch-through resistance, by setting the impurity concentration of the shallow region 32 of the first region 5 of the p-type body layer 100, which functions as a channel, to be low and by setting the impurity concentration of the deep region 31 except for the channel to be high. As s result, it is possible to further miniaturize a device. If it is possible to miniaturize a device, it is possible to reduce the on-state resistance of a device. As a result, it is possible to reduce the power consumption of a device.

In addition, the above described ion-implantation is a step of implanting ions vertical to the surface of the substrate.

Also, in the above described first and second embodiments of the present invention, an n-type MOSFET is explained. However, it is also possible to apply the present invention to a p-type MOSFET by using a different type of ion species.

Furthermore, the above described gate electrode is comprised of a polysilicon layer having impurities. However, it is not necessarily limited to this structure. The upper region of the gate electrode may be comprised of a silicide layer or a self-aligned silicide (salicide) layer in order to further reduce the resistance of the gate electrode.

The above described thickness of each layer and the impurity concentration of each layer are illustrative only, and it should be understood that they can be changed.

This application claims priority to Japanese Patent Application No. 2005-063096. The entire disclosure of Japanese Patent Application No. 2005-063096 is hereby incorporated herein by reference.

The terms of degree such as "substantially" and "nearly" used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a semiconductor device, comprising the steps of:
   (a) forming a first region by selectively ion-implanting a second conductive type impurity into a first conductive type semiconductor layer without conducting any thermal diffusion of impurities, wherein step (a) comprises the step of selectively ion-implanting the second conductivity type impurity by using a first mask having an opening therein;
   (b) forming a gate electrode that includes an edge vicinity region that is aligned with the first region in the horizontal position, wherein step (b) comprises the step of defining the edge of the gate electrode by means of a first edge of the opening; and
   (c) forming a body layer that includes the first region and a second region that is formed adjacent to the first region, and self-aligned with the first region and an edge of the gate electrode, by forming the second region by selectively ion-implanting the second conductive type impurity into the first conductive type semiconductor layer without conducting any thermal diffusion of impurities, wherein step (c) comprises the step of selectively ion-implanting the second conductive type impurity by using the edge vicinity portion as a mask, and self-aligning a boundary between the first region and the second region with the edge of the gate electrode,
   wherein the opening is extended by selectively eliminating the first mask after the step of forming the first region without eliminating the first edge of the opening;
   wherein an insulating film is formed on the first region;
   wherein the extended opening is completely filled with a gate electrode substance that comprises the gate electrode after the step of forming the insulating film; and
   wherein the gate electrode substance is planarized, so that the gate electrode is disposed in the extended opening and has a planarized upper surface.

2. The method according to claim 1, wherein the first region has an interface that is substantially vertical with respect to the first conductive type semiconductor layer.

3. The method according to claim 1, wherein the boundary between the first region and the second region is self-aligned with the edge of the gate electrode.

4. The method according to claim 1, wherein the steps of forming the first region and the second region further comprise the step of conducting a thermal treatment in which the ion-implanted second type impurity is activated but not thermally diffused after the step of selective ion-implantation, respectively.

5. The method according to claim 1, wherein the first mask includes a silicon nitride film formed on the first conductive type semiconductor layer.

6. The method according to claim 1, wherein the gate electrode includes a polysilicon that contains impurities.

7. The method according to claim 1, wherein the step of selectively eliminating the first mask is conducted with an anisotropic etching by using a resist pattern having an opening that has an edge located within a region of the first region in the horizontal position.

8. The method according to claim 1, wherein the first region is provided with an impurity profile in the depth direction in which the impurity concentration of a shallow region that includes a channel region is lower than the impurity concentration of a deep region located below the shallow region, by conducting the step of ion-implantation to form the first region by changing the acceleration energy and the dosage of the second conductive type impurity.

9. The method according to claim 1, wherein the semiconductor device is a lateral power metal-oxide semiconductor field-effect transistor.

10. A method for manufacturing a semiconductor device, comprising the steps of:
    forming a first region by selectively ion-implanting a second conductive type impurity into a first conductive type semiconductor layer by using a first mask having an opening without conducting any thermal diffusion of impurities;
    extending the opening by selectively eliminating the first mask with an anisotropic etching by using a resist pattern having an opening that has an edge located within the first region in the horizontal position without eliminating the first edge of the opening;

forming an insulating film on the first region;
completely filling the extended opening with a gate electrode substance comprising the gate electrode after the step of forming the insulating film;
planarizing the gate electrode substance;
forming a gate electrode that has a planarized upper surface in the expanded opening by defining an edge of the gate electrode with a first edge of the opening, the gate electrode including an edge vicinity region that is aligned with the first region in the horizontal position; and
forming a body layer including the first region and a second region that is formed adjacent to the first region, and self-aligned with the first region and an edge of the gate electrode, by forming the second region with a step of selectively ion-implanting a second conductive type impurity into the first conductive type semiconductor layer by using the edge vicinity region as a mask without conducting any thermal diffusion of impurities, the step of forming the second region self-aligning a boundary between the first region and the second region with the edge of the gate electrode.

* * * * *